(12) United States Patent
Chamberlin et al.

(10) Patent No.: US 11,317,182 B2
(45) Date of Patent: Apr. 26, 2022

(54) PORTABLE SPEAKER SYSTEM

(71) Applicant: Amazon Technologies, Inc., Seattle, WA (US)

(72) Inventors: Christopher Mann Chamberlin, Austin, TX (US); Chia Hung Kuo, San Jose, CA (US); Jacob William Beatty, Mountain View, CA (US); Duane Everard Whyte, San Jose, CA (US); Adrian Roy Ramiscal Santos, San Jose, CA (US); Isabella Talley Lewis, San Jose, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 17/175,218

(22) Filed: Feb. 12, 2021

(65) Prior Publication Data

US 2021/0204047 A1    Jul. 1, 2021

Related U.S. Application Data

(63) Continuation of application No. 16/535,535, filed on Aug. 8, 2019, now Pat. No. 10,958,997, which is a
(Continued)

(51) Int. Cl.
*H04R 1/02* (2006.01)
*H05K 1/02* (2006.01)
(Continued)

(52) U.S. Cl.
CPC .............. *H04R 1/025* (2013.01); *B23P 19/04* (2013.01); *H02J 7/00* (2013.01); *H02J 7/0042* (2013.01);
(Continued)

(58) Field of Classification Search
None
See application file for complete search history.

(56) References Cited

U.S. PATENT DOCUMENTS 8,967,323 B1    3/2015   Grenier
9,036,858 B1    5/2015   Reeves et al.
(Continued)

OTHER PUBLICATIONS

"Amazon Echo Teardown." IFIXIT, Feb. 11, 2015, www.ifixit.com/Teardown/Amazon+Echo+Teardown/33953. (Year: 2015).*
(Continued)

*Primary Examiner* — James K Mooney
(74) *Attorney, Agent, or Firm* — Lee & Hayes, P.C.

(57) ABSTRACT

A portable audio input/output device may include one or more openings that extend through a cover of the device and allow acoustic signals outside a housing of the device to reach a microphone disposed within the housing. The opening(s) may be illuminated by a light guide disposed within the housing, which scatters light emitted from lights disposed within the housing. In some instances, a hole may pass through a printed circuit board to allow acoustic signals to be received by the microphone disposed below the printed circuit board. An input/output (I/O) interface module with multiple buttons and inputs may be installed in the hole. The multiple buttons and I/O ports of the I/O interface module may be aligned along an axis vertical relative to the housing and centered with respect to each other.

19 Claims, 14 Drawing Sheets

Related U.S. Application Data continuation of application No. 15/801,102, filed on Nov. 1, 2017, now Pat. No. 10,425,712, which is a continuation of application No. 14/869,897, filed on Sep. 29, 2015, now Pat. No. 9,843,851.

(60) Provisional application No. 62/165,890, filed on May 22, 2015.

(51) Int. Cl.
| | |
|---|---|
| *H04R 1/34* | (2006.01) |
| *H02J 7/00* | (2006.01) |
| *B23P 19/04* | (2006.01) |
| *H05K 1/18* | (2006.01) |

(52) U.S. Cl.
CPC ............. *H04R 1/028* (2013.01); *H04R 1/342* (2013.01); *H05K 1/0278* (2013.01); *H04R 2201/02* (2013.01); *H04R 2201/029* (2013.01); *H04R 2201/40* (2013.01); *H04R 2420/09* (2013.01); *H05K 1/0272* (2013.01); *H05K 1/0274* (2013.01); *H05K 1/189* (2013.01); *H05K 2201/053* (2013.01); *H05K 2201/09063* (2013.01); *H05K 2201/10053* (2013.01); *H05K 2201/10083* (2013.01)

(56) References Cited

U.S. PATENT DOCUMENTS

| | | |
|---|---|---|
| 2001/0042657 A1 | 11/2001 | Yoshii et al. |
| 2004/0192225 A1 | 9/2004 | Mahn |
| 2004/0247151 A1 | 12/2004 | Smith |
| 2005/0094832 A1 | 5/2005 | Song et al. |
| 2005/0105740 A1 | 5/2005 | Dyer |
| 2007/0115624 A1 | 5/2007 | Knight |
| 2008/0166006 A1 | 7/2008 | Hankey et al. |
| 2009/0034778 A1 | 2/2009 | Chi |
| 2009/0040756 A1 | 2/2009 | Avtzon et al. |
| 2009/0103759 A1 | 4/2009 | Liu |
| 2009/0114554 A1 | 5/2009 | Earnest |
| 2009/0245565 A1 | 10/2009 | Mittleman et al. |
| 2011/0013800 A1 | 1/2011 | Akino |
| 2014/0140556 A1 | 5/2014 | Yim et al. |
| 2015/0022620 A1 | 1/2015 | Siminoff |
| 2015/0098582 A1 | 4/2015 | Florczak et al. |
| 2015/0304754 A1 | 10/2015 | Akino |
| 2016/0334076 A1 | 11/2016 | Dong et al. |
| 2016/0345086 A1 | 11/2016 | Chamberlin et al. |
| 2019/0364349 A1 | 11/2019 | Chamberlin et al. |

OTHER PUBLICATIONS

"Amazon Echo Teardown", retrieved on Sep. 20, 2016 at <<https://web.archive.org/web/20150211004749/https://www.ifixit.com/Teardown/Amazon+Echo+Teardown/33953>>, iFixit, Nov. 21, 2015, 11 pages.

Office action for U.S. Appl. No. 14/869,897, dated Jan. 13, 2017, Chamberlin et al., "Portable Speaker System", 15 pages.

Non Final Office Action dated Feb. 8, 2019 for U.S. Appl. No. 15/801,102 "Portable Speaker System" Chamberlin, 10 pages.

Office action for U.S. Appl. No. 14/869,917, dated Mar. 22, 2017, Chamberlin et al., "Electronic Device With Seamless Fabric Assembly", 14 pages.

Office Action for U.S. Appl. No. 16/535,535, dated Sep. 16, 2020, Chamberlin, "Portable Speaker System", 11 Pages.

Office Action for U.S. Appl. No. 15/872,486, dated Sep. 5, 2019, Chamberlin, "Electronic Device With Seamless Fabric Assembly", 17 pages.

PCT Invitation to Pay Additional Fees mailed Jul. 22, 2016 for PCT Application No. PCT/US16/33462, 2 pages.

PCT Search Report and Written Opinion dated Oct. 17, 2016 for PCT Application No. PCT/US16/33462, 11 pages.

\* cited by examiner

PORTABLE SPEAKER SYSTEM

RELATED APPLICATIONS

This application claims priority to and is a continuation of U.S. patent application Ser. No. 16/535,535, filed on Aug. 8, 2019, entitled "PORTABLE SPEAKER SYSTEM", which is a continuation of U.S. patent application Ser. No. 15/801, 102, filed on Nov. 1, 2017, entitled "PORTABLE SPEAKER SYSTEM", which is a continuation of U.S. patent application Ser. No. 14/869,897, filed on Sep. 29, 2015, entitled "PORTABLE SPEAKER SYSTEM", now U.S. Pat. No. 9,843,851, which issued on Dec. 12, 2017, which claims the benefit of U.S. Provisional Application Ser. No. 62/165,890, filed May 22, 2015, entitled "PORTABLE AUDIO INPUT/OUTPUT DEVICE," which is incorporated herein by reference.

BACKGROUND

Homes are becoming more connected with the proliferation of computing devices, such as desktops, tablets, entertainment systems, and portable communication devices. As these computing devices continue to evolve, many different ways have been introduced to allow users to interact with the computing devices, such as through speech. In order to receive acoustic signals, existing products typically have multiple microphone ports in the enclosure of the device. This exposes the microphones to potential damage from spills or moisture, and detracts from the aesthetic appearance of the device. Also, existing devices provide numerous indicator lights to provide information to a user. However, the number of indicator lights increases the cost of the devices and the chances that one of the indicators will fail. Additionally, existing devices that have a flexible exterior material are typically made of multiple panels of material or have one or more seams. This weakens the material and detracts from the aesthetic appearance of these devices.

DETAILED DESCRIPTION

Figure 1:
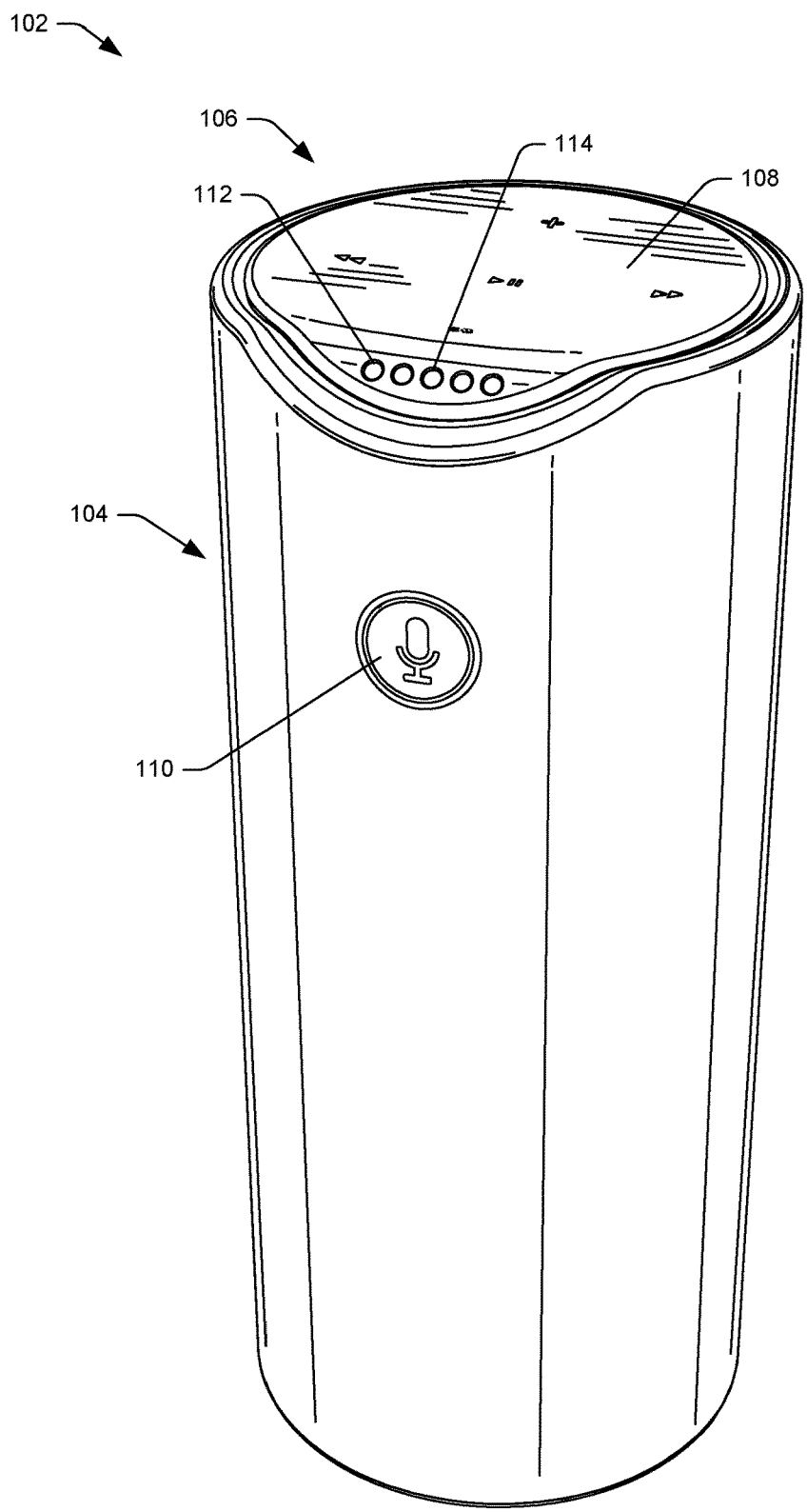
FIG. 1 illustrates a perspective view of an example portable audio input/output device taken from above.

As discussed above, existing electronic devices that receive audio input often have multiple microphone ports in the enclosure. These multiple microphone ports expose the microphones to damage from liquid (e.g., spills, rain, etc.) and detract from the aesthetic appearance of the devices. Many existing electronic devices also include numerous indicator lights which increase the cost of the devices and likelihood of a light failing. In the case of electronic devices, such as speakers, which have flexible exterior material, the exterior of the devices is typically made of multiple panels of material and/or has a seam in the material, which results in weaker and less aesthetically appealing exterior appearances.

This application describes electronic devices and techniques for manufacturing electronic devices that, in some examples, prevent damage to components of the devices. In some examples, electronic devices according to this application may have a light guide for evenly illuminating one or more indicators in a cover of the electronic device using fewer lighting emitting devices than there are indicators. In some examples, one or more of the indicators may comprise openings or ports that serve the additional purpose of transmitting audio signals from an exterior of the electronic device to a microphone located inside a housing of the electronic device. Electronic devices according to this application may additionally or alternatively include a flexible exterior material that is seamless and provides strong, flexible exterior that has a smooth aesthetic appearance.

By way of example and not limitation, an electronic device according to this application may comprise a portable audio input/output device configured to receive audio input and to provide audio output. Such a portable audio input/output device may be used in conjunction with a network-based speech support service server to implement a speech interface and to play music or output other audio in response to spoken user commands. However, the techniques described in this application are not limited to use with a portable audio input/output device and are generally applicable to other electronic devices, such as desktop computers, laptop computers, speakers, portable or console gaming devices, televisions, set-top boxes, media players, cameras, and/or portable electronic devices.

In some examples, a portable audio input/output device may have multiple visual indicators located on a control surface of the device. The visual indicators may be used to indicate various information to a user, such as to provide visual feedback regarding a task or operation being performed. The visual indicators may, in some examples, be disposed on a top portion or cover of the device. The visual indicators may be illuminated by one or more light sources, such as light emitting diodes (LEDs), located within a housing of the portable audio input/output device, via a light guide. In some examples, a number of light sources may be less than a number of visual indicators. In that case, the light guide may diffuse the light from the light sources to evenly illuminate the visual indicators.

In some examples, the visual indicators may comprise one or more openings in a cover of the portable audio input/output device. Some or all of the openings in the cover may be aligned with ports in the light guide, such that light from the light sources illuminates the ports in the light guide and the openings in the cover. One or more of the ports in the light guide may lead to a microphone disposed within the housing of the portable audio input/output device, while one or more other ports may comprise false openings that do not lead to the microphone. This may limit moisture or other objects from reaching the microphone. In some examples, the microphone may be coupled to and located below a printed circuit board (PCB) disposed within the device, while the light guide and light sources are coupled to a top surface of the PCB. As described herein, a PCB may comprise any type of PCB, including but not limited to a single sided PCB, double sided PCB, multi layered PCB, and/or a flexible PCB. One or more layers of audibly permeable hydrophobic material may be disposed in an audio path between an exterior of the device and the microphone to provide further protection from moisture.

In some examples, portable audio input/output devices may have a hole in the housing to receive a stand-alone input/output (I/O) interface module. The interface module may have multiple buttons and multiple input and/or output ports aligned vertically relative to a housing of the device. That is, when the device is positioned on a horizontal support surface, the buttons, jacks, and other inputs and outputs are positioned in substantially a vertical line. In some examples, the buttons may correspond to a power button for the device, a wireless connectivity button, or any other type of button or control. The buttons or other controls may be mechanical (e.g., having physically movable components) and/or electronic (e.g., capacitive sensors, optical sensors, or the like). The input and/or output ports may include universal serial bus (USB) ports, audio jacks, video jacks, or any other type of ports for receiving and/or outputting signals from/to other devices. In some examples, the I/O interface module may be constructed as a stand-alone, acoustically-sealed module. Constructing the module as a stand-alone module may simplify assembly and installation of the I/O module. By acoustically-sealing the I/O module, audio output and sound quality of the portable audio input/output device may be improved. Additionally or alternatively, unwanted acoustic signals will not be able to enter the housing through the module, which may improve acoustic interpretation of signals received through the port that leads to the microphone.

In some examples, the portable audio input/output device may have a housing that is wrapped by a seamless material, such as a seamless fabric or mesh. The seamless material may be installed by sliding a tube of the material over a frame of the housing, like a sleeve. In some examples, the seamless material may have an open top end that wraps around a top rim of frame of the housing and an open bottom end that wraps around a bottom rim of the frame. In some examples, the top end of the seamless material may be compressed and held in place by a cover assembly and the bottom end of the seamless material may be compressed and held in place by a charging foot of the portable audio input/output device. By not having a seam, the seamless material may be stronger than material with seams. Additionally, the seamless material may be more aesthetically pleasing compared to material with seams.

The charging foot may serve as a base allowing the portable audio input/output device to sit horizontally on flat surfaces. The charging foot may have an inner contact comprising a circle and an outer contact in a ring shape (e.g., hollow middle). The inner contact and outer contact may comprise electrically-conductive material. These contacts may be fixed in a non-electrically-conductive structure (e.g., plastic) and separated mechanically and electrically by this structure. In some examples, the inner contact and outer contact may comprise a positive and negative terminal to charge a battery internal to the device and/or power circuitry of the device when the portable audio input/output device is placed in a charging station.

The charging foot may be sized to fit into the charging station and stand in an upright position while in the charging station. The charging station may have two contacts (e.g., pins) protruding from it and lining up with the inner contact and outer contact such that, regardless of the charging foot orientation within the charging station, the contacts and pins maintain an electrical connection. In this way, the charging station may provide power to the portable audio input/output device using the electrical contact formed by the contacts and the pins.

The portable audio input/output device may have a talk button that the user presses when speaking a command. While the talk button is pressed, the portable music device captures user audio and provides the user audio to the speech support service server. The speech support service server performs automatic speech recognition (ASR) and natural language understanding (NLU) to determine which audio content the user wants to play. Upon identifying the audio content, the portable audio input/output device streams the audio content from a network-based content source and plays the audio content on one or more speakers of the portable audio input/output device.

The portable audio input/output device may have a rechargeable battery so that the device can be used without connection to an external power source. However, the audio input/output device may also be used with a charging station that provides external electrical power for battery recharging and to provide power to the device while the device is in the charging station.

When the portable audio input/output device is docked and/or receiving external power, the device may activate enhanced capabilities. As an example, the portable audio input/output device may itself may have speech processing capabilities, such as wakeword detection, ASR, and/or NLU. These features may be active all the time, or only when the device is receiving power from an external source. As a specific example, the device may use wakeword detection when docked and receiving external power, so that the user is not required to press the talk button in order to direct speech to the device. In that case, the portable audio input/output device continually monitors sound within its environment, detects a user utterance of a wakeword, and subsequently captures user audio and provides the user audio to the speech support service server for further analysis. When the portable audio input/output device is undocked from the charging station, the portable audio input/output device may only monitor audio input when a user presses a talk button.

As another specific example, the device may activate device-supported ASR features when receiving external power and may respond to certain types of user speech without relying on network-based speech support services.

In other examples, the user may interact with the device only after pushing a "push-to-activate" button to activate the ASR services. In that case, there may be no always-listening capabilities (whether in the charging station or not) and the wakeword may only be recognized after the user has pushed the "push-to-activate" button.

Example Portable Audio Input/Output Device

Figure 2:
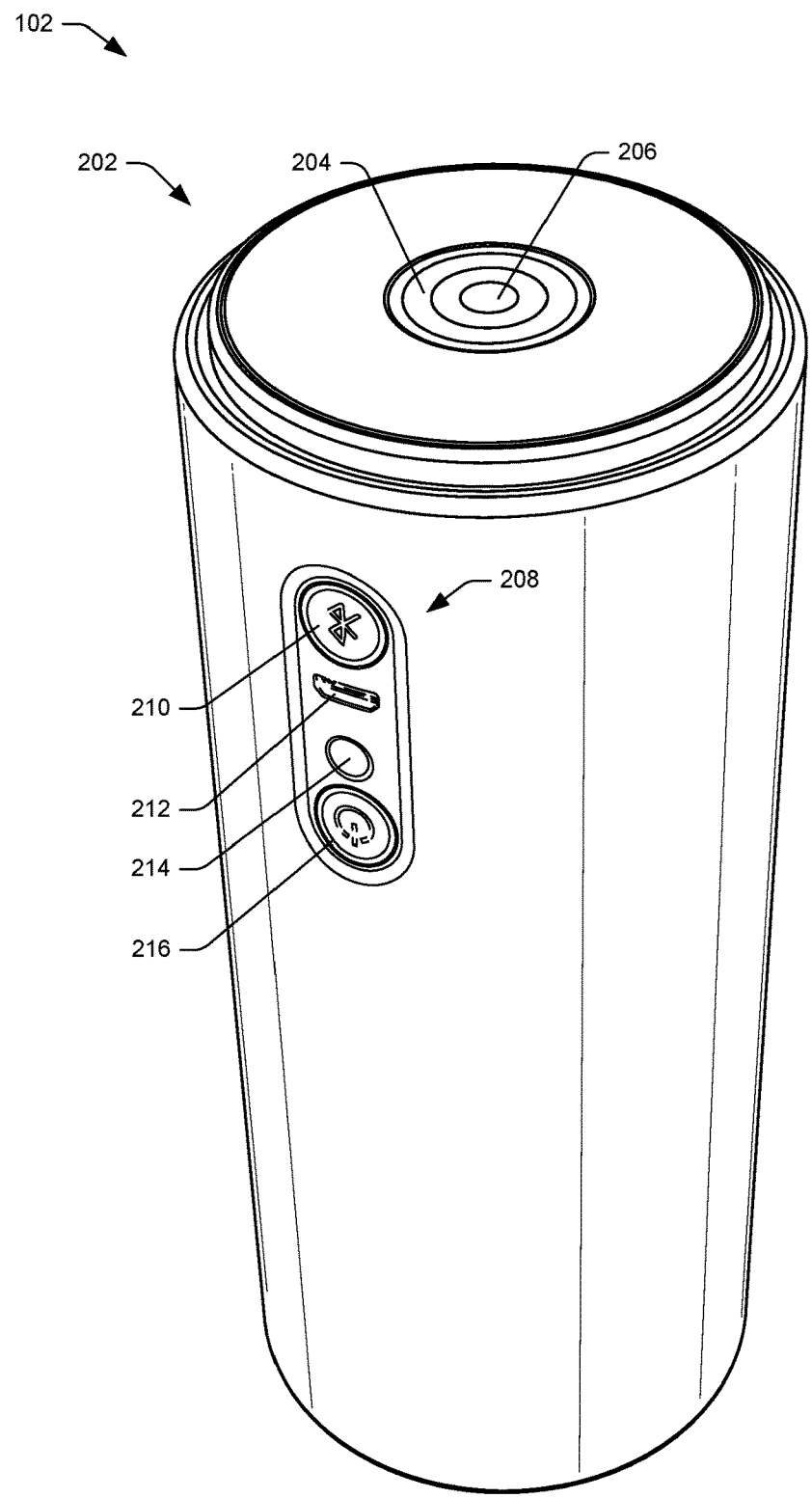
FIG. 2 illustrates another perspective view of the example portable audio input/output device of FIG. 1 taken from below.

FIGS. 1-3 illustrate an example portable audio input/output device 102.

FIG. 1 is a perspective view of the portable audio input/output device 102 taken from above. The portable audio input/output device 102 may comprise a substantially cylindrical housing 104, a cover assembly 106 including a navigation cap 108, and a talk button 110. The talk button 110 may also be referred to as a talk actuator or a push-to-talk (PTT) button.

The cover assembly 106 may comprise the navigation cap 108, openings 112, and a central opening 114. In some examples, the navigation cap 108 may have buttons or other controls, such as volume buttons, play control buttons, etc. In various examples, the navigation cap 108 may have one or more visual indicators for presentation of information to a user of the portable audio input/output device 102. In the illustrated example, the visual indicators comprise five openings in the cover, which may be illuminated by one or more light sources within the housing 104. The visual indicators may be illuminated statically (e.g., one or more visual indicators illuminated continuously) or dynamically (e.g., one or more visual indicators flashing, alternating which visual indicators are illuminated, etc.).

While the openings 112 are illustrated in FIG. 1 as comprising five openings, in other example the number the openings 112 may comprise any number of openings. In some examples, one or more of the openings 112 may comprise openings allowing for audio to be received by a microphone disposed within housing 104. In some examples, a microphone may be located within housing 104 and receive audio input via openings 112. For example, a microphone may receive audio via a central opening 114 of the openings 112 shown in FIG. 5.

The portable audio input/output device 102 may be designed and configured to rest on a surface. In addition, the device 102 may be designed for handheld use during which a user holds the device 102 and speaks into the microphone while pressing the talk button 110. The portable audio input/output device 102 may be configured so that the talk button 110 is easily accessed by a user's thumb when holding the portable audio input/output device 102 near the user's mouth.

In some examples, the microphone may be selected and/or designed for sensitivity to near-field audio so as to capture user speech when the microphone is held near the mouth of the user. The microphone generates an audio signal that contains the user speech.

The portable audio input/output device 102 may be powered by a rechargeable internal battery (not visible) for cordless operation. The device 102 may have contacts, charging ports (e.g., a USB port or AC charging port), or a charging foot that can receive external power by means of a charging station or cradle in order to charge the internal battery and/or to operate from household power mains.

The portable audio input/output device 102 may be configured to capture and respond to user speech. Specifically, the user may verbally request particular music to be played by the portable audio input/output device 102. The portable audio input/output device 102 responds to the request by playing the music on speakers. In certain situations, the user may need to press the talk button 110 when speaking a request. In other cases, the user may indicate a request by prefacing the request with a predefined keyword, which is also referred to herein as a wakeword or trigger expression. In some examples, the portable audio input/output device 102 may rely on the talk button 110 to detect spoken user requests when the portable audio input/output device 102 is operating from battery power and may or may not enable wakeword detection when the music device 102 is receiving external power. Disabling wakeword detection when operating on battery power may reduce computational activities and power consumption, thereby increasing battery life.

The portable audio input/output device 102 may be supported by network-based services such as speech support services that perform ASR and NLU on audio captured by the microphone and that provide instructions to the portable audio input/output device 102 in response to recognized speech. This allows relatively sophisticated audio and speech processing to be performed despite limited processing capabilities of the portable audio input/output device 102 itself.

In some cases, however, the portable audio input/output device 102 may have at least limited speech recognition capabilities. In various embodiments, different levels of speech support may be provided by the device 102 when receiving external power, such as ASR, NLU, and speech synthesis. Performing these functions locally avoids delays and latencies that may otherwise be introduced by interacting with network-based services.

The portable audio input/output device 102 may be configured to operate in multiple playback modes to play audio content such as music and in some cases to also control the playing of audio content by peripheral devices. In one playback mode, the portable audio input/output device 102 acts as a peripheral speaker for a personal media device such as a smartphone, tablet computer, or other device that may be configured to act as a personal media storage device. In this mode, referred to as a peripheral mode, the portable audio input/output device 102 receives an audio stream over a device-to-device wireless connection such as a Bluetooth® connection and passively plays the received audio stream on the speakers. The audio stream may contain music or other audio content that has been selected through a user interface of the personal media device, apart from the speech interface of the portable audio input/output device 102.

In another playback mode, referred to herein as a voice control mode, the portable audio input/output device 102 implements a speech interface through which the user selects and plays music by speaking commands to the device 102. In some embodiments, the voice control mode is used only during those times during which the device 102 has broadband Internet connectivity. During other times, the portable audio input/output device 102 operates in the peripheral mode.

When operating in the voice control mode, the user speaks a verbal command into the microphone 312 while actuating the talk button 110. The user speech is analyzed and interpreted to identify particular music or other audio content that the user wants to play. The identified content is then obtained and/or played by the device 102.

By default, content identified in this manner is played on the speakers 106 of the device 102. However, the device 102 may also be configured to provide the content to available peripheral devices such as Bluetooth speakers or other speaker peripherals that are nearby. For example, the device 102 may be configured to play music using the sound system of an automobile during times in which the device 102 is within the automobile. Similarly, the device 102 may be configured to play music using a home audio system during times in which the device 102 is within the home. In other examples, the portable audio input/output device 102 may be configured to synchronize with another portable audio input/output device to provide multiple ports of audio (e.g., stereo, surround sound, etc.).

In some embodiments, the portable audio input/output device 102 may be configured to actively and automatically determine whether it is near any peripheral devices and to play audio content using peripheral devices that are in the proximity of the user and/or of the device 102.

Figure 12:
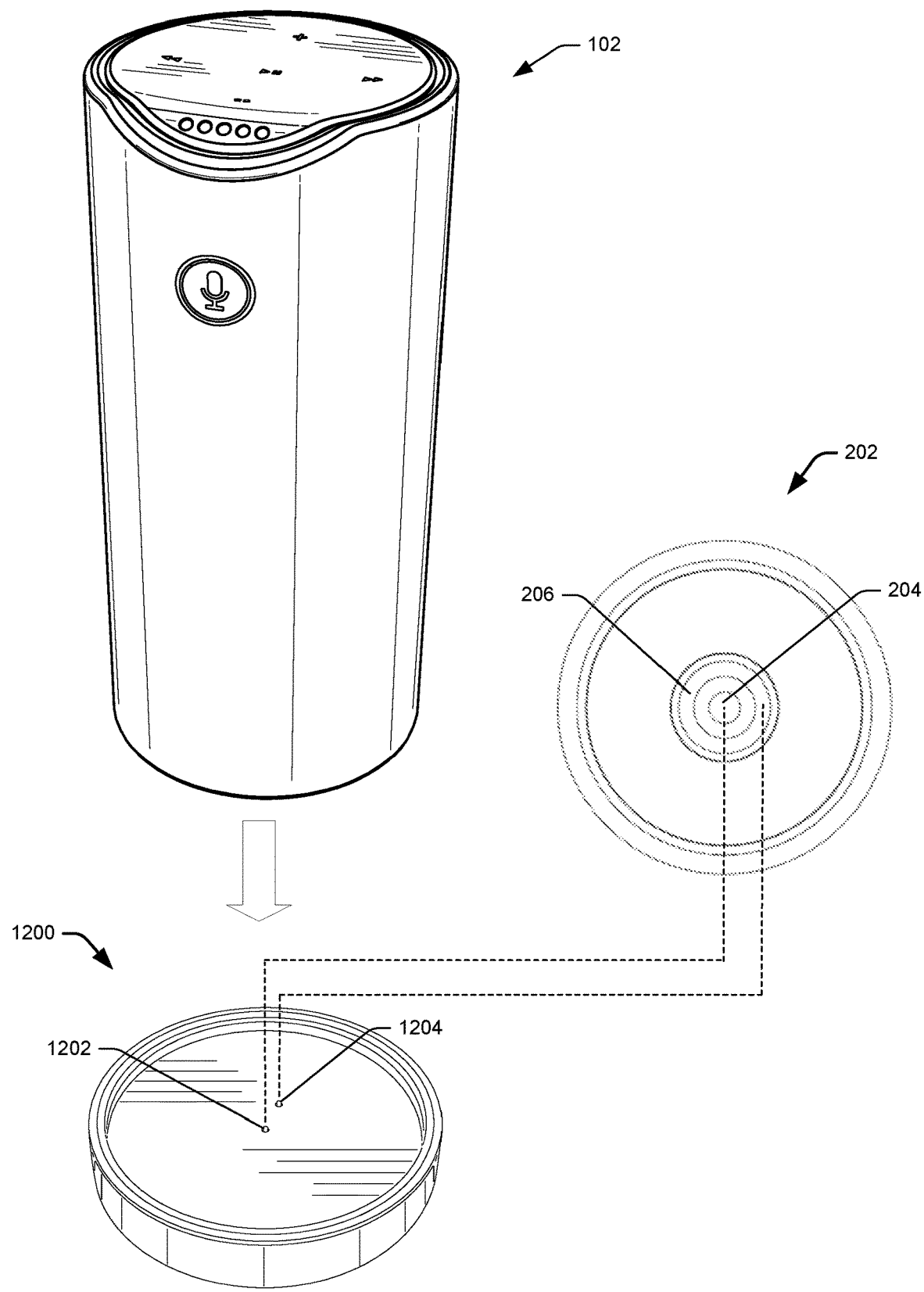
FIG. 12 illustrates a schematic view of the example portable audio/input device being placed in a charging station.

FIG. 2 is another perspective view of the portable audio input/output device of FIG. 1 taken from below. The portable audio input/output device 102 may include a charging foot 202 located on the bottom of the device. In some examples, the charging foot 202 may comprise charging contacts, such as an inner contact 204 and an outer contact 206. The charging foot inner contact 204 and outer contact 206 may receive external power from a charging station or cradle in order to charge the internal battery and/or to operate from household power mains (e.g., wall outlet). A charging station (as shown in FIG. 12) may be used to charge the internal battery and/or provide power to the portable audio input/output device 102 using the inner contact 204 and outer contact 206. For example, inner contact 204 and outer contact 206 may be electrically coupled to positive and negative ends of the internal battery directly or via a battery controller such that the charging station may provide, from an external power source, power to charge the internal battery and/or power the portable audio input/output device 102. In some examples, inner contact 204 may comprise a substantially circular shape. Similarly, outer contact 206 may comprise a substantial circular shape, such as a ring.

The portable audio input/output device 102 may further comprise input/output (I/O) interface module 208 installed in housing 104. I/O interface module may include any assortment of buttons or contacts usable to interact with portable audio input/output device 102. For example, I/O interface module may include a wireless communication button 210, a universal serial bus (USB) port 212, an input jack 214, and/or a power button 216. Wireless communication button 210 may be selectively engaged to enable various wireless communication capabilities (e.g., Bluetooth®, Wi-Fi®, etc.). In some examples, wireless communication button 210 may engage circuitry of portable audio input/output device 102 to facilitate various wireless communication capabilities. For instance, portable audio input/output device 102 may be configured for communication with other devices, such as mobile phones, tablets, computers, other portable audio input/output devices, and/or any other computing device capable of wireless communication.

USB port 212 may be configured to receive one or more USB devices containing various information. For example, USB port 212 may receive a USB device that is storing various audio files that may be played on speakers 106 of portable audio input/output device 102. Additionally, USB port 212 may be used for charging, installing updates, communicating with other devices, etc.

Input jack 214 may be configured to receive one or more input mechanisms, such as a phone jack, audio jack, or jack plug. In various examples, input jack 214 may communicate via the input mechanisms to receive information in the form of analog and/or digital signals. In some examples, input jack 214 may be a jack having various industry standard measurements (e.g., 2.5 mm, 3.5 mm, etc.) in order to receive various input.

Power button 216 may be selectively engaged to power on or power off portable audio input/output device 102. Additionally or alternatively, power button 216 may be selectively engaged to change a mode of portable audio input/output device 102, such as engaging a "sleep mode" where various functionalities of portable audio input/output device 102 are disabled and/or enabled.

Figure 3A:
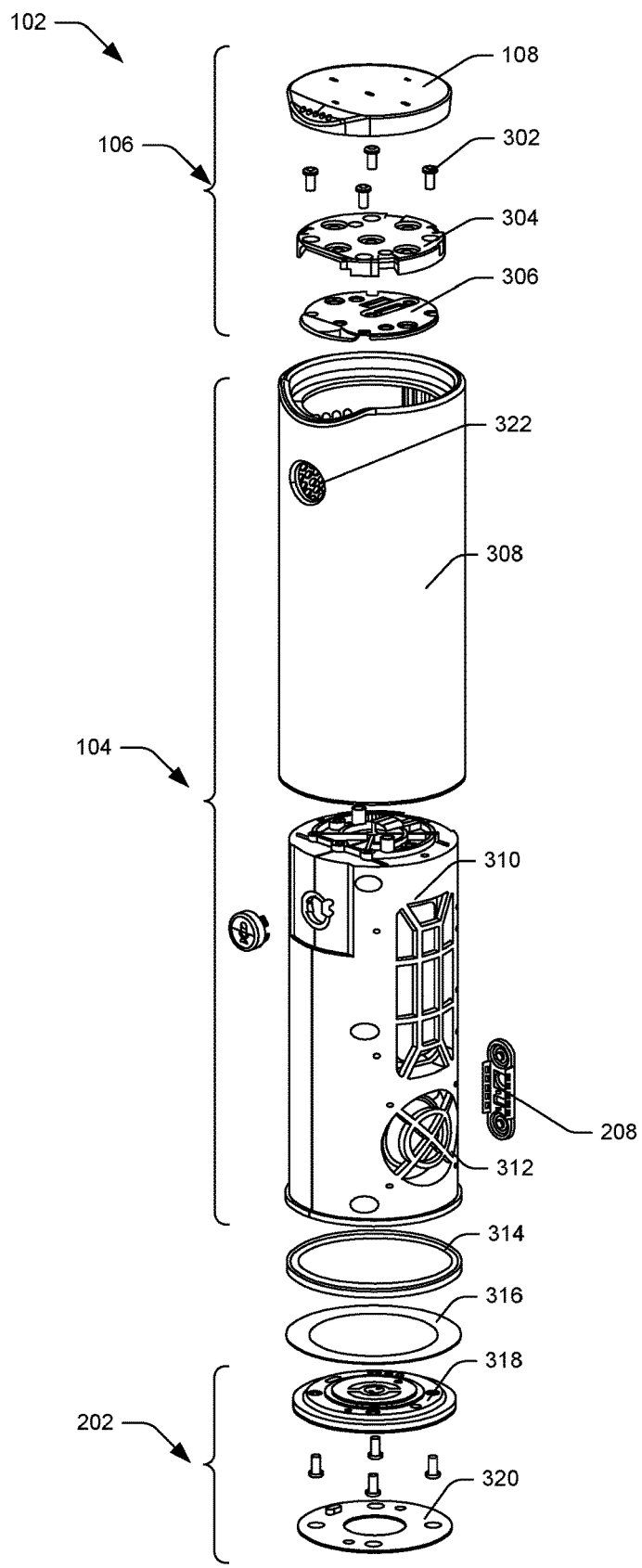
FIG. 3A illustrates a partial exploded view of the example portable audio input/output device of FIG. 1.

FIG. 3A illustrates a partial exploded view of the portable audio input/output device of FIG. 1. In some examples, cover assembly 106 may comprise one or more screws or other fasteners 302 that attach the navigation cap 108, a navigation housing 304, and a printed circuit board (PCB) navigation component 306. In some examples, navigation housing 304 and PCB navigation component 306 may receive various inputs received via the navigation cap 108 (e.g., inputs from input interface) and map the input to various hardware and/or software components of portable audio input/output device 102. Additionally, one or more screws or other fasteners 302 may facilitate attachment of cover assembly 106 to housing 104 and/or enclosure assembly 310. In other instances, navigation cap 108, navigation housing 304 and PCB navigation component 306 may be attached by other fastening means, such as screw in, snap in, pressure fit, etc.

In some examples, housing 104 may comprise a substantially cylindrical frame 308 which is sized to encircle an assembly enclosure 310. Assembly enclosure 310 may further comprise a microphone 312 for receiving acoustic signals, such as through openings 112.

In some examples, assembly enclosure 310 may have a bumper 314 coupled to its bottom end. Bumper 314 may be attached to the bottom end of assembly enclosure 310 to provide shock absorption and/or to provide for a softer edge. In some examples, bumper 314 may comprise shock absorbent material, such as rubber, or any other type of material for absorbing shock. Additionally, bumper 314 may have rounded or smoothed edges that cover the bottom end of assembly enclosure 310 and/or substantially cylindrical frame 308. The rubber bumper 314 may prevent the seamless tube 324 from being cut or damaged by sharp edges of the assembly enclosure 310 and/or substantially cylindrical frame 308.

In some examples, charging foot 202 may be attached to enclosure assembly 310 by one or more means, such as adhesive tape 316 (e.g., single-sided or double-sided adhesive tape), glue, screws, snap fit, press fit, threads, and/or other fasteners. Charging foot 202 may comprise a charging module 318 and a bottom cap 320. In some examples, bottom cap 320 may be attached to the bottom of charging foot charging module 318 to protect the components of charging foot 202 and surfaces on which the portable audio input/output device 102 is placed and provide aesthetic appeal, while keeping exposed the inner contact 204 and an outer contact 206.

Frame 308 may have a hole 322 sized to receive a component, such as talk button 110. Similarly, assembly enclosure 310 may have a corresponding hole to receive and couple the talk button 110 in.

Figure 3B:
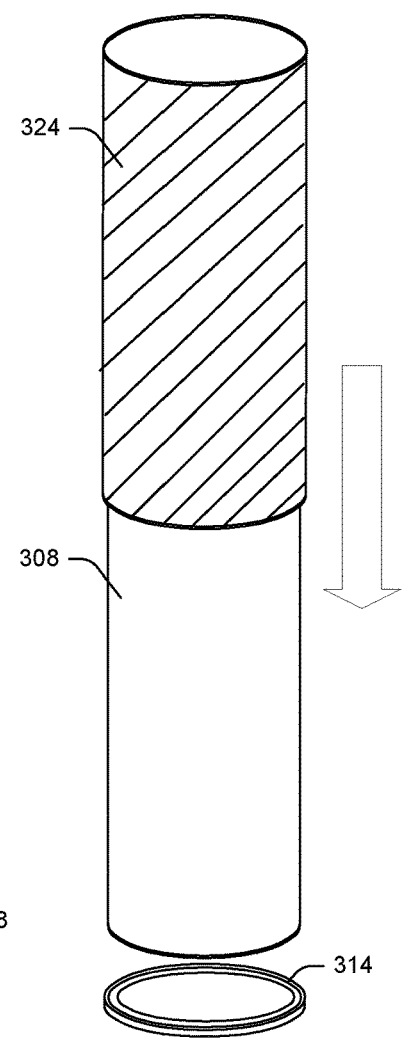
FIG. 3B illustrates a schematic view showing installation of the seamless tube of material on a cylindrical frame of the housing.

FIG. 3B illustrates a schematic view showing installation of the seamless tube of material on a cylindrical frame of a portable audio input/output device shown in FIG. 1. In some examples, the seamless tube 324 may comprise knitted fabric or a mesh of metal.

In some examples, a seamless tube 324 may be fitted over the frame 308. The seamless tube 324 may comprise fabric, metal, or any other type of material that can form a mesh, and does not have a seam in the material. In some examples, the seamless tube 324 may be pulled on over frame 308, like a tube, and encircles frame 308. Seamless tube 324 may be attached to frame 308 using glue, adhesive, or any other type of fastening mechanism. Further description regarding assembly and installation of the seamless tube will be discussed with reference to FIG. 9.

Example Light Guide Ports

Figure 4:
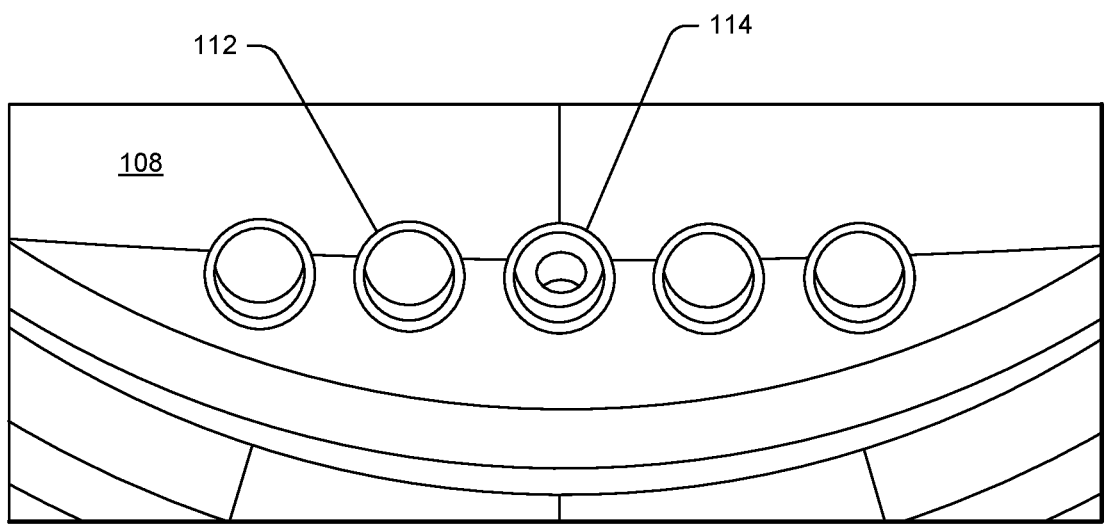
FIG. 4 illustrates a perspective view of a top portion of the example portable audio input/output device of FIG. 1, showing openings in a cover assembly of the portable audio input/output device.
Figure 5:
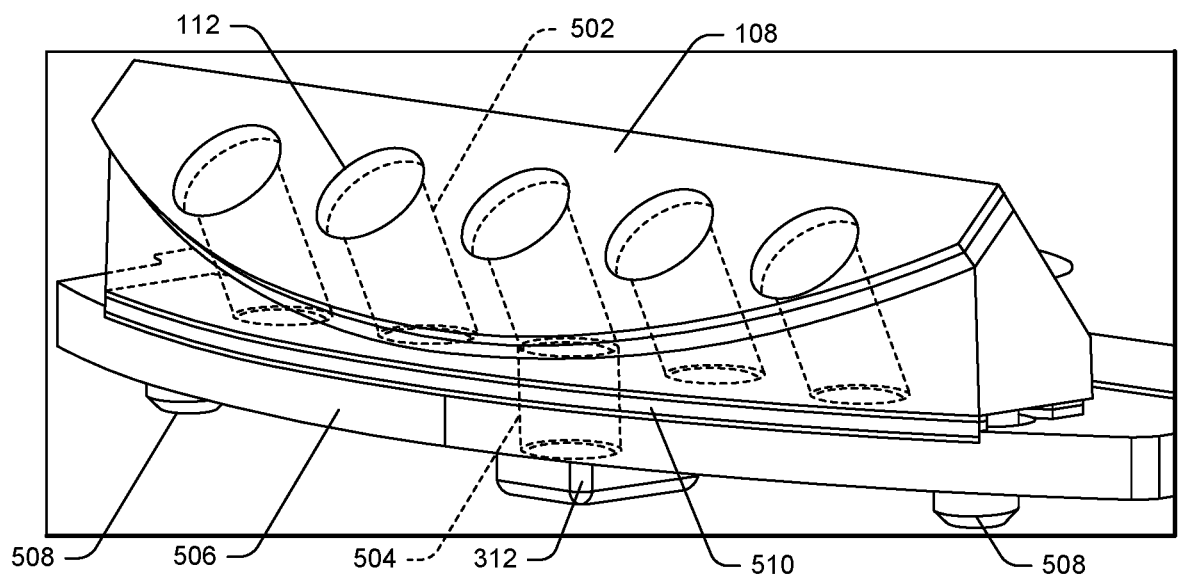
FIG. 5 illustrates a cutaway perspective view of the example portable audio/input device of FIG. 1, with a cover removed to show ports passing through a light guide of the portable audio/input device.
Figure 6:
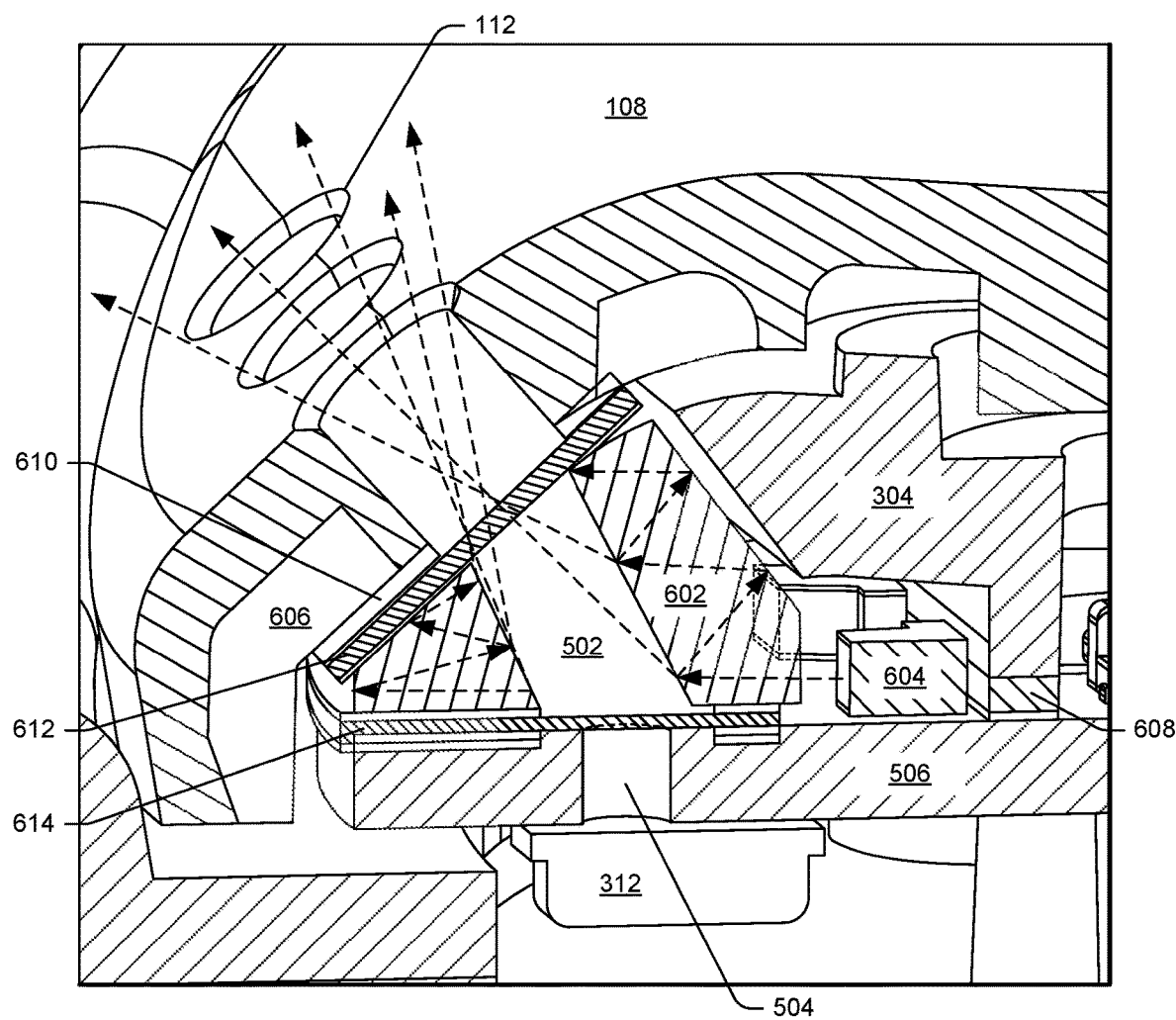
FIG. 6 illustrates a partial cross-sectional view of a top portion of the example portable audio/input device of FIG. 1, showing details of the cover assembly and light guide.

FIGS. 4-6 illustrate views of example ports and an example light guide (e.g., light diffuser) to illuminate the ports, such as openings 112 of portable audio/input device 102.

FIG. 4 illustrates a perspective view of a cover of the example portable audio input/output device of FIG. 1, showing openings in a cover assembly of the portable audio input/output device. In some examples, the openings 112 may be arranged in a substantially horizontal arrangement in navigation cap 108. In some examples, a microphone, such as microphone 312 may be disposed within housing 104 and navigation cap 108 to receive acoustic signals via openings 112. For example, microphone 312 may be disposed within housing 104 and under central opening 114 of the openings 112, as shown in FIG. 4. However, in other examples, microphone 312 may be disposed under any of the openings 112 to receive acoustic signals.

FIG. 5 illustrates a cutaway perspective view of the example portable audio/input device of FIG. 1, with a cover removed to show ports passing through a light guide of the portable audio/input device. In some examples, the openings may comprise circular holes in a surface portion of the navigation cap 108 of portable audio/input device 102. Additionally, the surface portion may have one or more layers of material (e.g., fabric) disposed on top of it to prevent objects from entering into the openings 112. For example, a mesh fabric may be disposed over the surface portion to prevent liquids, or other objects, from entering into the openings 112.

As noted above, the openings 112 may comprise ports 502 that pass through the navigation cap 108. Additionally, at least one of the openings 112 may further comprise a microphone hole 504. In various examples, microphone hole 504 may comprise one or more holes in a printed circuit board (PCB) 506 disposed within the housing 104 of portable audio/input device 102. Microphone hole 504 may allow acoustic signals to pass from the exterior of housing 104 to microphone 312. In the example of FIG. 5, microphone 312 is disposed on an under portion of PCB 506, while in other examples, microphone 312 may be disposed on a top portion of PCB 506. In some examples, microphone hole 504 may be aligned with a port from ports 502. The port may in turn be aligned with central opening 114. In some examples, the ports 502, excluding the port aligned with microphone hole 504, may comprise false ports that are acoustically insulated from the microphone 312. For instance, the remaining ports 502 may not have a corresponding hole that passes through the PCB 506.

One or more locating pins 508 may protrude from, or be attached to, PCB 506. In various examples, the one or more locating pins 508 may be used to correctly position the navigation cap 108 into the appropriate place for installation in enclosure assembly 310. For example, enclosure assembly 310 may include corresponding holes to receive the one or more locating pins 508 for correct placement and installation in portable audio/input device 102. Further, in some examples, a foam adhesive 510 may be used to attach PCB 506 to navigation cap 108. However, it is understood that other fastening mechanisms may be employed in different examples, such as tape, glue, screws, etc. In some examples, ports 502 may further pass through foam adhesive 510. For example, ports 502 may further extend through foam adhesive 502 and end when they reach PCB 506. Thus, in these examples, a portion of PCB 506 may be observed when looking down through openings 112 through ports 502. In examples where ports 502 do not extend through PCB 506, they may be referred to as false ports. However, in other examples, one or more of ports 502 may have holes which extend through PCB 506, similar to microphone hole 504, and allow acoustic signals to pass through PCB 506. In various examples, one or more of the ports 502 that have holes which extend through PCB 506 may have their own individual microphones for receiving acoustic signals. Accordingly, multiple microphones may be employed, one for each of ports 502 that have holes which extend through PCB 506. Having multiple microphones may, for example, allow for far-field acoustic signal detection.

FIG. 6 illustrates a partial cross-sectional view of a top portion of the example portable audio/input device of FIG. 1, showing details of the cover assembly and light guide. The microphone hole 504, which may be aligned with central opening 114, may pass through PCB 506. In some examples, one or more light emitting diodes (LEDs) 604 may emit light towards the light guide 602. Light guide 602 may comprise any type of light diffuser and have a circumference corresponding to the openings 112 and form ports 502 from the openings 112 to PCB 506 and/or microphone 312. LEDs 604 may be disposed on top of a portion of PCB 506. The light emitted from LEDs 604 may be emitted towards light guide 602 may bounce around, or reflect, within the light guide 602 and emit at various angles from light guide 602 out of the openings 112. In some instances, light guide may comprise a milky material, such as polycarbonate, that causes the light to disperse at various angles, as illustrated in FIG. 6 by the dashed lines and arrows. The polycarbonate may, in some examples, have dye or other material within to reflect light at various angles that enters the light guide. Moreover, light guide 602 may comprise a shape with at least various surfaces at various angles to further reflect light. For instance, light guide 602 may have a cross section comprising a first surface adjacent to ports 502, a second surface adjacent to the LEDs 604, and a third surface adjacent to microphone 312. By employing light guide 602, which is disposed below the openings 112, the openings 112 may be illuminated with a substantially uniform dispersion of light. The various angles at which the light guide 602 is disposed below the openings 112 and above the PCB 506 may further aid in evenly dispersing the light from the light guide 602 by causing the light to bounce around the light guide 602 at a plurality of different angles. Additionally, by using light guide 602, the amount of LEDs 604 may be decreased. For example, in the absence of a light guide, each port 502 of the openings 112 may require their own, individual LED to obtain a substantially equal light distribution through the openings 112. However, using light guide 602 to disperse the emitted light evenly, less LEDs may be used to evenly illuminate the openings 112. For example, using light guide 602, the openings 112 may comprise five total ports 502, whereas the LEDs 604 may only comprise three LEDs.

Microphone 312 may be disposed under the PCB 506, as shown in FIG. 5. In various examples, the microphone hole 504 may provide a hole in the PCB 506 to enable acoustic signals to be received via the openings 112 and through light guide 602 via ports 502.

In some examples, one or more components of portable audio/input device 102 may be employed to prevent light leakage. For example, navigation housing 304 may prevent light from leaking from the back of light guide 602. Thus, rather than the light leaving light guide 602 and bouncing around the inside of housing 104, navigation housing 304 may be disposed along the back portion of light guide 602 to bounce the light back into light guide 602. Similarly, extended lip 606 may be disposed along the front of light guide 602 to prevent light from leaking out of the front of the guide. In some examples, extended lip 606 may be part cover assembly 106 (as illustrated in FIG. 3). Additionally, in some examples, a foam piece 608 may be disposed between navigation housing 304 and PCB 506 to prevent leakage of light from the back of light guide 602. In instances where navigation housing 304 is not flush with PCB 506, foam piece 608 may be inserted to fill any space between navigation housing 304 and PCB 506 to prevent light leakage.

In some examples, various components may be employed to acoustically seal the microphone hole 504 and/or openings 112. For example, sealing foam 610 may be positioned between navigation cap 108, extended lip 606, and/or light guide 602. The sealing foam 610 may be disposed around the circumference of the openings 112 to prevent acoustic signals from escaping from the openings 112 and microphone 312. Thus, by using the sealing foam 610 to seal the port between the openings 112, light guide 602, and microphone 312, acoustically sealed ports 502 may be formed from the entrance of the openings 112 to the microphone 312. This may result in improved quality of acoustic signal received at the microphone 312.

In some examples, an acoustic mesh is disposed in various locations of the port from openings 112 and microphone 312. For example, acoustic mesh 612 may be disposed between navigation cap 108 and sealing foam 610 or light guide 602. Similarly, acoustic mesh 614 may also, in some examples, be placed between light guide 602 and PCB 506. The mesh may cover ports 502 formed by the openings 112 and light guide 602, but the material forming the acoustic mesh may allow light and acoustic signals to pass through without substantially attenuating the signals. However, acoustic mesh 612 and 614 may prevent objects and liquids from passing through the ports formed by light guide 602 and the openings 112 by covering the area formed by ports 502. For example, acoustic mesh 614 may comprise fabric, metal, or any other material usable to form a mesh and present objects and liquids from passing through to the light guide 602 and/or microphone 312. In some examples, sealing foam 610 may be positioned above acoustic mesh 612 (as shown), while in other examples, sealing foam 610 may be positioned below acoustic mesh 612 and/or 614. In some examples, one, both, or neither of acoustic mesh 612 and 614 may be used.

Example Input/Output Interface Module

Figure 7:
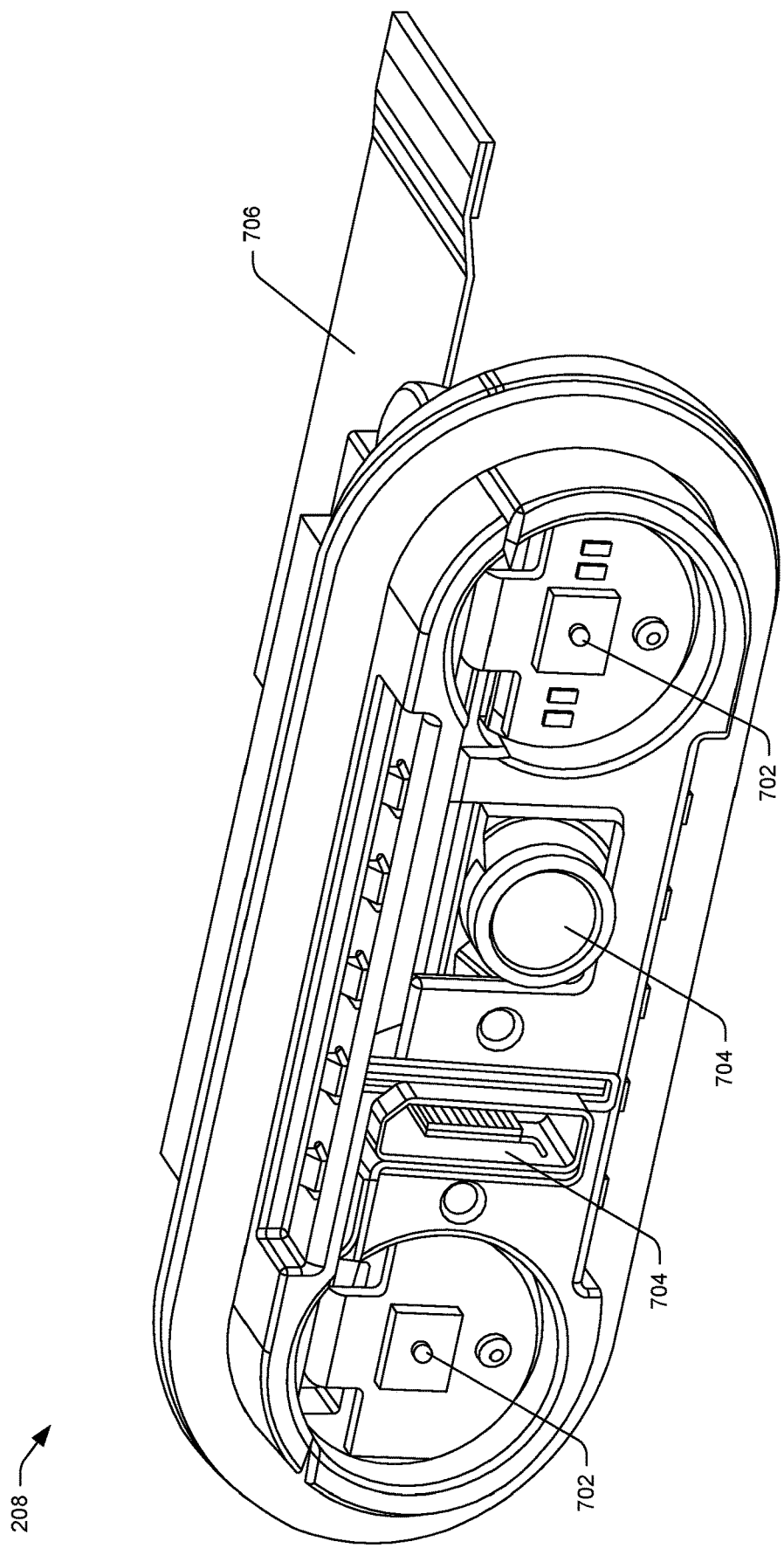
FIG. 7 illustrates a perspective view of an example input/output interface module installable in the portable audio/input device of FIG. 1.
Figure 8:
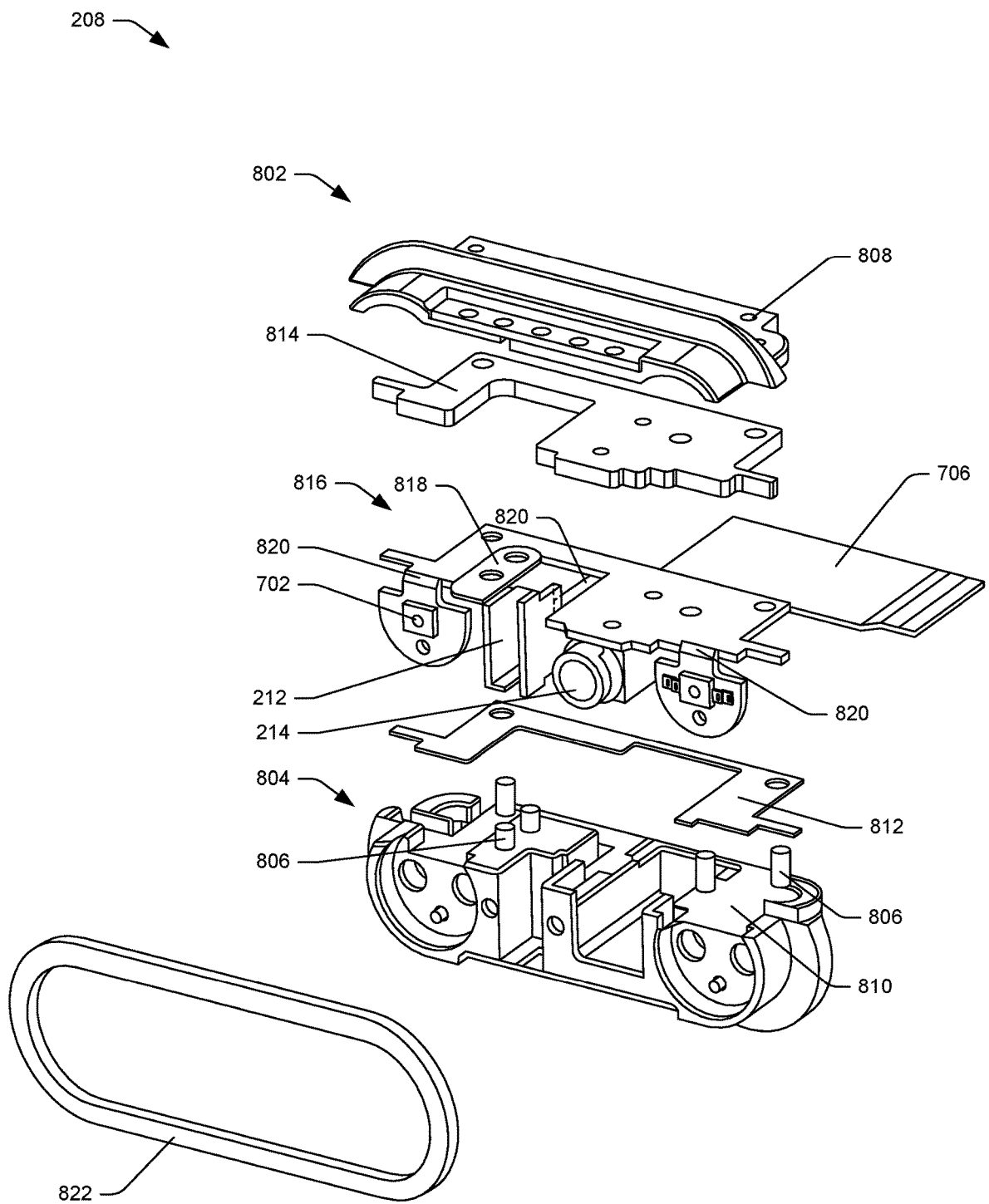
FIG. 8 illustrates a partial exploded view of the example input/output interface module of FIG. 7.

FIGS. 7 and 8 illustrate a perspective and exploded views of an example input/output interface module installable in portable audio/input device of FIG. 1. FIG. 7 illustrates a perspective view of an I/O interface module 208 that may comprise buttons 702 and one or more input/output (I/O) ports 704. The one or more I/O ports 704 may receive input, provide output, or both. In some examples, the buttons 702 may be configured to have caps or contacts placed over them indicating a function associated with the buttons 702. For example, the buttons 702 may be associated with power button 216 and/or wireless communication button 210. Similarly, the one or more I/O ports 704 may be associated with USB port 212 and/or input jack 214, as described in FIG. 2.

The I/O interface module 208 may additionally have a connecting part 706 that may be removeably coupled to a portion of the portable audio/input device 102. For example, connecting part 706 may be fastened to PCB 506 using one or more fastening mechanisms, such as screws, glue, adhesive tape, etc. In some examples, connecting part 706 may be used to connect the I/O interface module 208 to a location within housing 104, such as a printed circuit board, when installing I/O interface module 208 in portable audio input/output device 102.

As illustrated in FIG. 7, the I/O interface module 208 may comprise a separate module that may be assembled separately from portable audio/input device 102, and subsequently installed into the device 102. By assembling I/O interface module 208 separate from the portable audio/input device 102, this may decrease difficulties in assembly, such as additional time and labor that would be required to install various components of the I/O interface module 208 within housing 104. Additionally, in some examples, the I/O interface module 208 may be acoustically sealed to prevent acoustic signals from interfering with those being received via other portions of the portable audio/input device, such as microphone 312. For example, various sounds may be associated with click of the buttons 702 and or inputting components into the one or more I/O ports 704. Additionally, by acoustically sealing I/O interface module 208, sounds that are occurring in the environment exterior to housing 104 may be kept from entering housing 104. In some examples, this may improve the reliability of the acoustic signal being received by microphone 312 by ensuring that acoustic signals are only received via the openings 112. By ensuring that microphone 312 is not catching stray or unwanted acoustic signals from various locations other than the openings 112, acoustic interpretation of the received signals may more accurately identify commands and input from users.

FIG. 8 illustrates a partial exploded view of the example input/output interface module of FIG. 7. I/O interface module 208 may have a structure formed in part by a top housing 802 and a bottom housing 804. Top housing 802 and bottom housing 804 are formed to fit together and form a housing for components of the I/O interface module 208. Top housing 802 and bottom housing 804 may comprise any material for providing support to components stored or placed within, such as plastic and/or metal. Bottom housing may have one or more through pins 806 that are used to align and hold in place various components of the I/O interface module 208. Further, top housing 802 may have corresponding through holes 808 that may accept, or receive, the through pins 806 when the I/O interface module 208 is assembled. In some examples, the through pins 806 may be attached within through holes 808 using various means such as pressure fit, nut and bolt, thermoplastic staking (e.g., heat staking), or any other fastening means.

In some examples, bottom housing 804 may further have foam tape 810 attached to its top surface. Foam tape 810 may be any type of double sided adhesive, and in some examples may couple bottom housing 822 to bottom seal 812. Additionally or alternatively, bottom seal 812 may have one or more holes to accept through pins 806 when assembling I/O interface module 208. Similarly, top housing 802 may also have foam tape or adhesive on a bottom portion (not shown) to fasten a top seal 814 in place. Additionally or alternatively, the through pins 806 may pass through holes on top seal 814 to align and hold top seal 814 within the top housing 802 and bottom housing 804.

In some examples, bottom seal 812 and top seal 822 may provide an acoustic seal for I/O interface module 208. For instance, by positioning bottom seal 812 on the top portion of bottom housing 804, and top seal 814 on the under portion of top housing 802, the interior components of I/O interface module 208 and portable audio input/output device 102 may be acoustically sealed from any acoustic signals attempting to pass through the module 208 from exterior the housing 104. Top seal 814 and bottom seal 812 may comprise any material or combination of materials, such as rubber, plastic, foam, metal, etc. that can be used to acoustically seal I/O interface module 208.

Disposed between top seal 814 and bottom seal 812 is a printed circuit board PCB 816. Generally, PCB 816 may comprise any type of printed circuit board that mechanically supports and electrically connects one or more components of I/O interface module 208. For instance, PCB 816 may connect electronic components using conductive paths etched from a conductive substrate (e.g., copper) that has been laminated, or printed, onto a non-conductive substrate, such as plastic. In some examples, the PCB 816 may comprise a flexible printed circuit board (FPCB).

Various components may be attached to PCB 816, such as buttons 702 (e.g., power button 216 and/or wireless communication button 210), USB port 212, and input jack 214.

Traditionally, electrical and mechanical components have been surface mounted to circuit boards (e.g., through-hole components), or mounted in in parallel with the circuit boards in order to provide structural support for the components. However, in some examples such as the example shown in FIG. 8, the buttons 702 and the one or more I/O ports 704 may be mounted to PCB 816 and extend in a direction parallel to the plane of PCB 816.

In some examples, the input jack 214 may be mounted to a bottom side of the PCB 816. The input jack 214 may be directly mounted, such as by through-hole attachment mechanisms, glue, thermoplastic staking, or any other type of attachment mechanism. In some examples, because the input jack 214 is mounted directly onto the bottom side of the PCB 816 and extends a set distance vertically from the bottom side, it may serve as a base line for orienting the remaining components. Stated otherwise, the input jack 214 may be a base location vertically from the PCB 816 that the other components (e.g., buttons 702 and USB port 212) may be aligned with the input jack 214 along a horizontal plane, centered with input jack 214. In examples such as this, the buttons 702 and the USB port 212 may have mechanisms that allow selective vertical and/or horizontal orientation of the components relative to the bottom side of the PCB 816.

For example, the buttons 702 and/or USB port 212 may comprise tabs 820 that attach the buttons 702 and USB port 212 to extend in a direction parallel to the plane of the PCB 816. The tabs 820 may be made of any type of material which is foldable or able to be manipulated to facilitate selective placement vertically of the buttons 702 and/or USB port 212 relative to the PCB 816. As illustrated, the tabs 820 may additionally serve as an attachment mechanism to attach the buttons 702 and/or USB port 212 to the PCB 816.

Additionally or alternatively, the USB port 212 may comprise a mechanism to facilitate selective placement of the USB port 212 relative to the PCB 816 vertically, as well as horizontally with the buttons 702 and input jack 214. For example, the USB port 212 may have a bracket 818 fixed to it which allows the USB port 212 to be structurally coupled to the PCB 816 at a substantially 90 degree angle. For instance, the bracket 818 may be attached in parallel to PCB 816 with a first end, bend at a substantially 90 degree angle, and have a component attached to a second end of the bracket 818. In some examples, the bracket 818 may be welded to USB port 212, or attached using any other type of process. Thus, USB port 212 may be aligned by at least one of tabs 820, bracket 818, or partly by both. Additionally, the bracket 818 may be attached to the PCB 816 in parallel using various attachment mechanisms, such as through pins (e.g., holes for through pins 806), thermoplastic staking, gluing, or any other attachment mechanism and any a combination thereof. While FIG. 8 illustrates USB port 212 as being coupled to the end of bracket 818 opposite the PCB 816, in other examples, any type of electrical or mechanical component may be coupled to bracket 818.

As noted above, the input jack 214 may serve as a baseline distance vertically from the PCB 816 by which the buttons 702 and USB port 212 may extend in a direction parallel to the plane of PCB 816 and align horizontally with input jack 214. In examples such as this, the tabs 820 and bracket 818 may be manipulated to extend the buttons 702 and USB port 212 to various distances in a direction parallel from a plane of the PCB 816. For example, the tabs 820 and bracket 818 may be foldable to extend the buttons 702 and USB port 212 to be substantially horizontal to input jack 214, thereby creating a horizontal alignment of the buttons 702, USB port 212, and input jack 214. The horizontal alignment may place the buttons 702 and USB port 212 centered with each other relative to the center of input jack 214.

Further, the tabs 820 and bracket 818 may provide structural support for the buttons 702 and USB port 212. For example, when a USB input is inserted, or withdrawn, from USB port 212, there may be jerking, pushing, or pulling on USB port 212. Similarly, when a user pushes the buttons 702, there may be pressure on the buttons to be pushed back. Accordingly, in some examples the tabs 820 and bracket 818 may be attached to PCB 816 in order to hold the buttons 702 and USB port 212 in place during use or actuation.

In some examples, I/O interface module 208 may have a radial seal 822 which attaches to the front of I/O interface module 208. For example, when the top housing 802 and bottom housing 804 are fitted together to hold the various intermediary components (e.g., bottom seal 812, top seal 814, PCB 816, etc.), the radial seal 822 may be fitted onto a front portion (e.g., perimeter) of a surface formed by the top housing 802 and the bottom housing 804. In some examples, the radial seal 822 is attached to the front portion of the top housing 802 and bottom housing 804 using one or more attachment mechanisms, such as press fit, tape, glue, any other attachment mechanism, or a combination thereof.

The radial seal 822 may be fitted to the front of I/O interface module 208 to acoustically seal the module. For example, when I/O interface module 208 is place in housing 104, as shown in FIG. 2, the radial seal 822 may be fitted to the front portion of the I/O interface module 208 to be substantially flush with frame 308. Once the radial seal 822 is attached to the I/O interface module 208, it may serve as an acoustic seal to prevent acoustic signals from entering the housing 104 through the I/O interface module 208.

In some examples, the radial seal 822, bottom seal 812, and top seal 814 may acoustically seal the I/O interface module 208 from acoustic signals exterior from housing 104. For example, when I/O interface module 208 has been assembled and inserted into the portable audio input/output device 102, the bottom seal 812, top seal 814, and radial seal 822 may prevent acoustic signals exterior to housing 104 from entering from the top, bottom, or front of I/O interface module 208. This may in turn keep acoustic signals from reaching the microphone 312 from paths other than paths designed to pass acoustic signals to microphone 312, such as openings 112. This may help improve acoustic interpretation by microphone 312 by reducing unwanted signals (e.g., noise) from entering housing 104.

Thus, as described herein, I/O interface module 208 may comprise a separate, stand-alone module that is acoustically sealed, and can be installed as an individual module into portable audio input/output device 102.

Seamless Fabric Assembly

Figure 9:
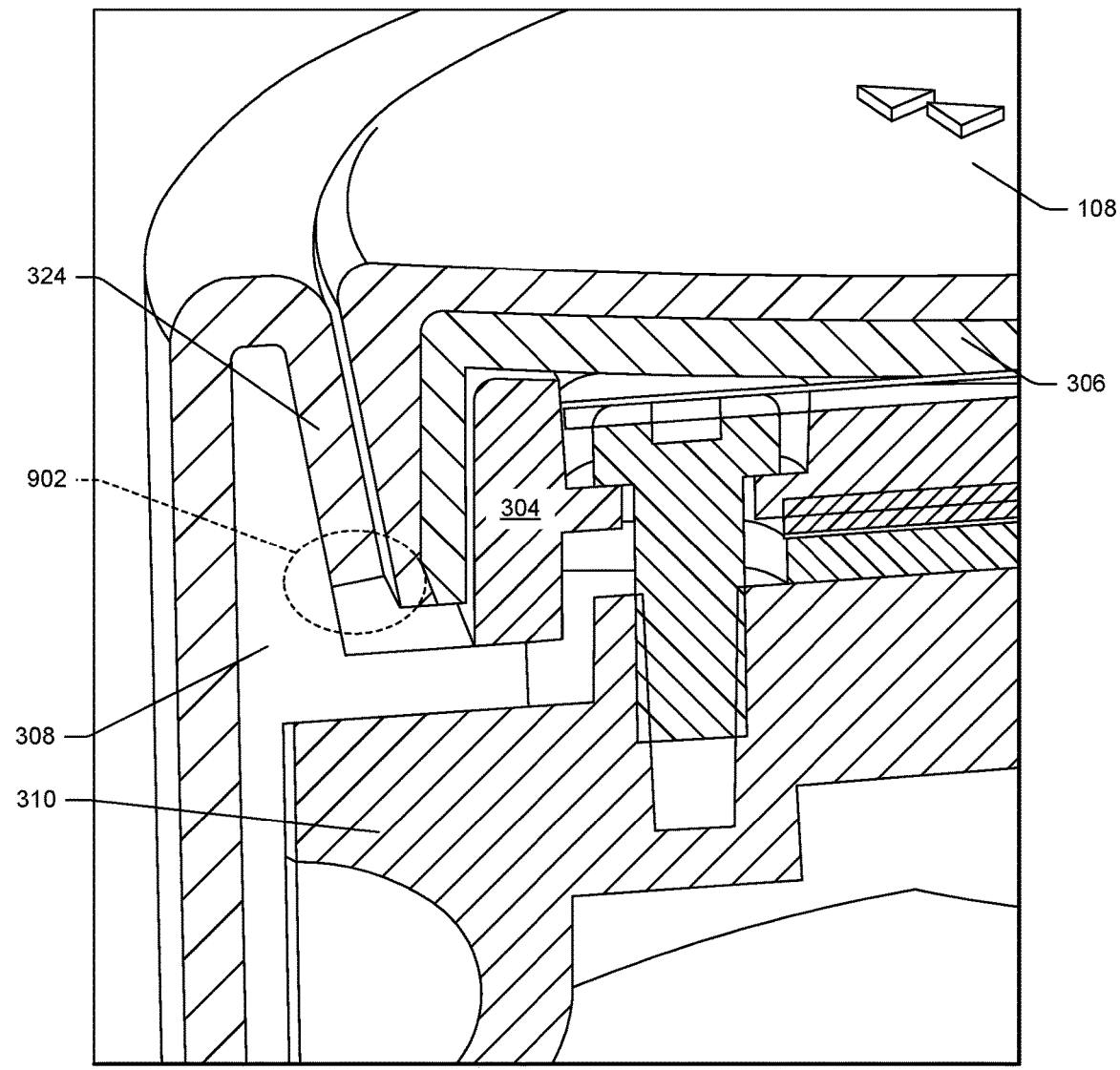
FIG. 9 illustrates a partial cross sectional view of an example seamless tube material encircling an exterior housing of the portable audio/input device of FIG. 1.

FIG. 9 illustrates a partial cross sectional view of an example seamless tube material encircling an exterior housing of the portable audio/input device of FIG. 1.

In some examples, a fabric assembly 900 may comprise seamless tube 324 enclosing frame 308. As described in FIG. 3, seamless tube 324 may be attached in some examples to frame 308 using glue, adhesive tape, or any other attachment mechanism. In various examples, seamless tube 324 may have a top end and a bottom end (not shown) comprising more material than necessary to envelope, or encircle, the frame 308. In instances such as this, the top end of the seamless tube 324 may be folded over (e.g., wrapped, tucked, etc.) frame 308 and compressed between frame 308 and navigation cap 108 in order to pin the top end 902 against frame 308 to hold the top end in place, as illustrated by the sphere 902. In some examples, an adhesive may be positioned between the top end of the seamless tube 324 and the interior wall of frame 308. By folding seamless tube 324 over frame 308 and holding the top end 902 of the material in place using the navigation cap 108, the top end 902 of the seamless tube 324 may be hidden from view externally.

Figure 10:
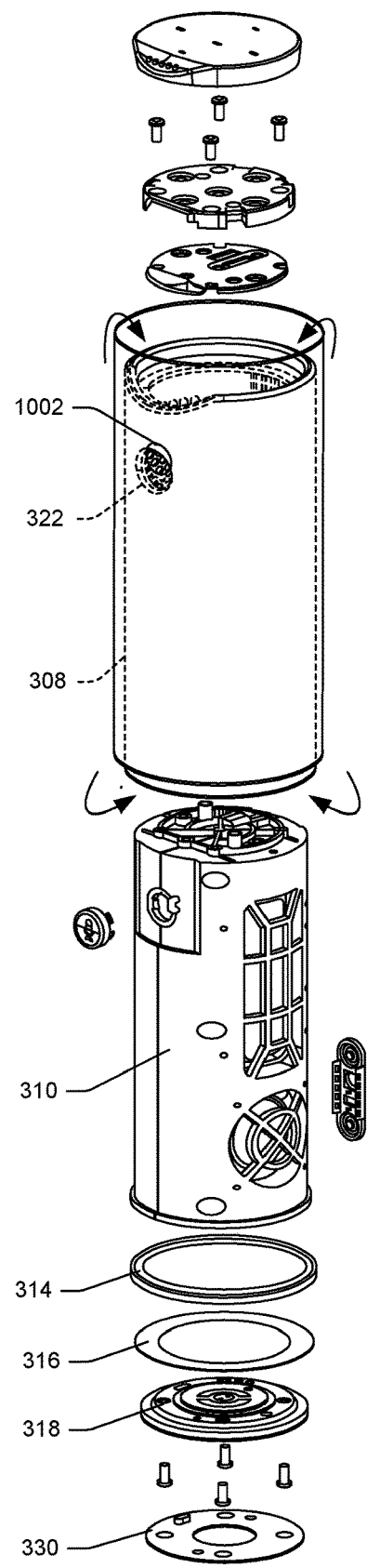
FIG. 10 illustrates a partial exploded view of the example portable audio input/output device of FIG. 1, showing additional details of installation of the seamless tube of material.

FIG. 10 illustrates a partial exploded view of the example portable audio input/output device of FIG. 1, showing additional details of installation of the seamless tube of material. In examples where seamless tube 324 may have a bottom end that is longer than the frame 308, the seamless tube 324 may be folded over a bottom end of frame 308. In various examples, bumper 314 may be coupled to the bottom end of assembly enclosure 310 to prevent ripping, tearing, or cutting of seamless tube 324 on the bottom end of assembly enclosure 310 and/or substantially cylindrical frame 308. In some examples, adhesive tape 316 may be a double sided adhesive tape and be attached to the bottom of enclosure assembly 310. When the seamless tube 324 is folded over the bottom of frame 308, it may be pressed onto the adhesive tape 316 to be fixed in place. Further, charging foot 202 may be placed over the seamless tube 324 to further pin the material in place between the charging foot 202 and the enclosure assembly 310. In this way, the bottom end of seamless tube 324 is not visible from the exterior of the portable audio input/output device 102. Additionally, in some examples bottom cap 312 may be fitted onto charging foot 202 for cosmetic appeal and to protect components of charging foot 202.

In some examples, seamless tube 324 may have a hole 1002 corresponding to hole 322 in frame 308. In some instances, a portion of the seamless tube 324 (e.g., a portion of the circumference of the hole in the material) may be folded into hole 322 and fixed to the interior of the housing 104. In some instances, the portion of the seamless tube 324 may be fixed to the interior of the housing using glue, double-sided adhesive, or any other attachment mechanism. Once the seamless material is fixed to the interior of frame 308, a component, such as talk button 110, may be installed in the hole 1002 of the seamless tube 322 and hole 322 in frame 308.

Charging Foot Assembly

Figure 11:
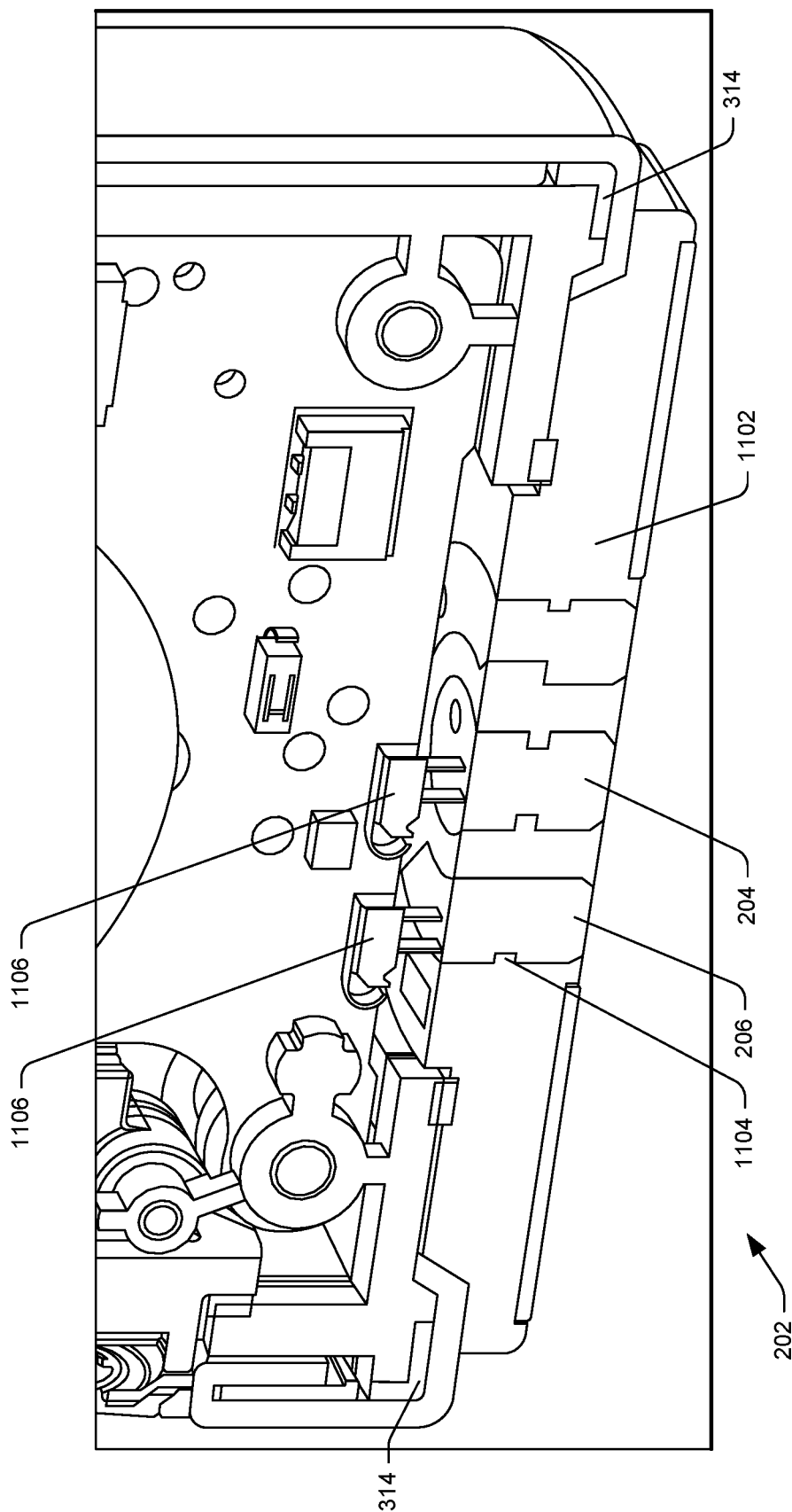
FIG. 11 illustrates a partial cross sectional view of an example charging foot of the example portable audio/input device of FIG. 1.

FIGS. 11 and 12 illustrate a charging foot assembly comprising a charging foot, such as charging foot 202, and a charging station (illustrated in FIG. 12).

FIG. 11 illustrates a partial cross sectional view of an example charging foot of the example portable audio/input device of FIG. 1. As described in FIG. 2, the charging foot 202 may comprise charging contacts, such as inner contact 204 and outer contact 206. Inner contact 204 and outer contact 206 may be comprised of any type of metal or metal alloy that is electrically conductive, such as copper, aluminum, gold, silver, or any other material for conducting electricity. In some examples, inner contact 204 and outer contact 206 may be part of a charging foot 202. Charging foot 202 may have a base structure 1102 that comprises plastic, or any other non-conductive material, that is formed around inner contact 204 and outer contact 206 to provide structural support. In some examples, charging foot 202 may be formed by molding, or by pouring melted material around inner contact 204 and outer contact 206 for base structure 1102 which encloses the contacts and provides structural support. In some examples, inner contact 204 and outer contact 206 may have notches 1104 that are filled with the material of charging foot 202 to provide additional structural support by fixing inner contact 204 and outer contact 206 within the charging foot 202 material to prevent movement of the inner contact 204 and outer contact 206, such as sliding or rotating. In some examples, charging foot 202 may be constructed as a standalone unit and formed independent of portable audio input/output device 102. Once charging foot 202 is formed, it may be attached to the bottom of portable audio input/output device 102.

In some examples, charging connectors 1106 may be disposed within housing 104 and be mechanically and/or electrically attached to PCB 506 such that, when charging foot 202 is attached to the bottom portion of portable audio input/output device 102, the charging contacts 1106 may touch inner contact 204 and outer contact 206 to create an electrical connection. Once the charging contacts 1106 touch inner contact 204 and outer contact 206, an electrical connection may be made between PCB 506 and inner contact 204 and outer contact 206 that can power a battery of portable audio input/output device 102 and/or PCB 506. In various examples, charging contacts 1106 may be any type of connector or contact, such as a spring contact.

FIG. 12 illustrates a schematic view of the example portable audio/input device being placed in a charging station. In some examples, the bottom of portable audio input/output device 102 may include charging foot 202, which includes inner contact 204 and outer contact 206.

Charging foot 202 may be sized to fit into a charging station, such as charging station 1200. Charging station 1200 may be designed to rest on a horizontal surface such as a table or desktop and to receive the charging foot 202. The portable audio input/output device 102 may be placed within (or on) and supported by the charging station 1200. The charging station 1200 is connected to an external power source such as a power mains or a direct-current (DC) adapter that is connected to the power mains. For example, a DC adapter may connect to a 110 volt alternating current (AC) power mains and may produce DC power in the range of 5 to 20 volts. An adapter such as this may be referred to as an AC-DC adapter. The DC power is provided through the power cable to the charging station. The charging station is configured to provide the external DC power to the portable audio input/output device 102 through the charging foot 202 of the device 102. Charging station 1200 may have a circumference configured to receive the charging foot 202 such that the portable audio input/output device 102 may be placed within the charging station 1200 to enable charging of the device while the device is standing in an upright position.

In some examples, charging station 1200 may comprise an inner pin 1202 and an outer pin 1204. Inner pin 1202 and an outer pin 1204 may positioned within the charging station 1200 such that, when charging foot 202 is placed on the charging station 1200, inner contact 204 and outer contact 206 make electrical contact with inner pin 1202 and outer pin 1204, respectively. As described above, inner contact 204 may comprise a circle and outer contact 206 may comprise a donut shape. Using this configuration, the placement of inner pin 1202 and outer pun 1204 may make electrical conduct with the inner contact 204 and outer contact 206 regardless of the orientation at which portable audio input/output device 102 is placed within charging station 1200. For example, once the charging foot 202 of portable audio input/audio device 102 is placed within charging station 1200, the device 102 may be spun or oriented in any direction within the charging station 1200 and maintain electrical contact with inner pin 1202 and outer pin 104.

Navigation Component Assembly

Figures 13A, 13B:
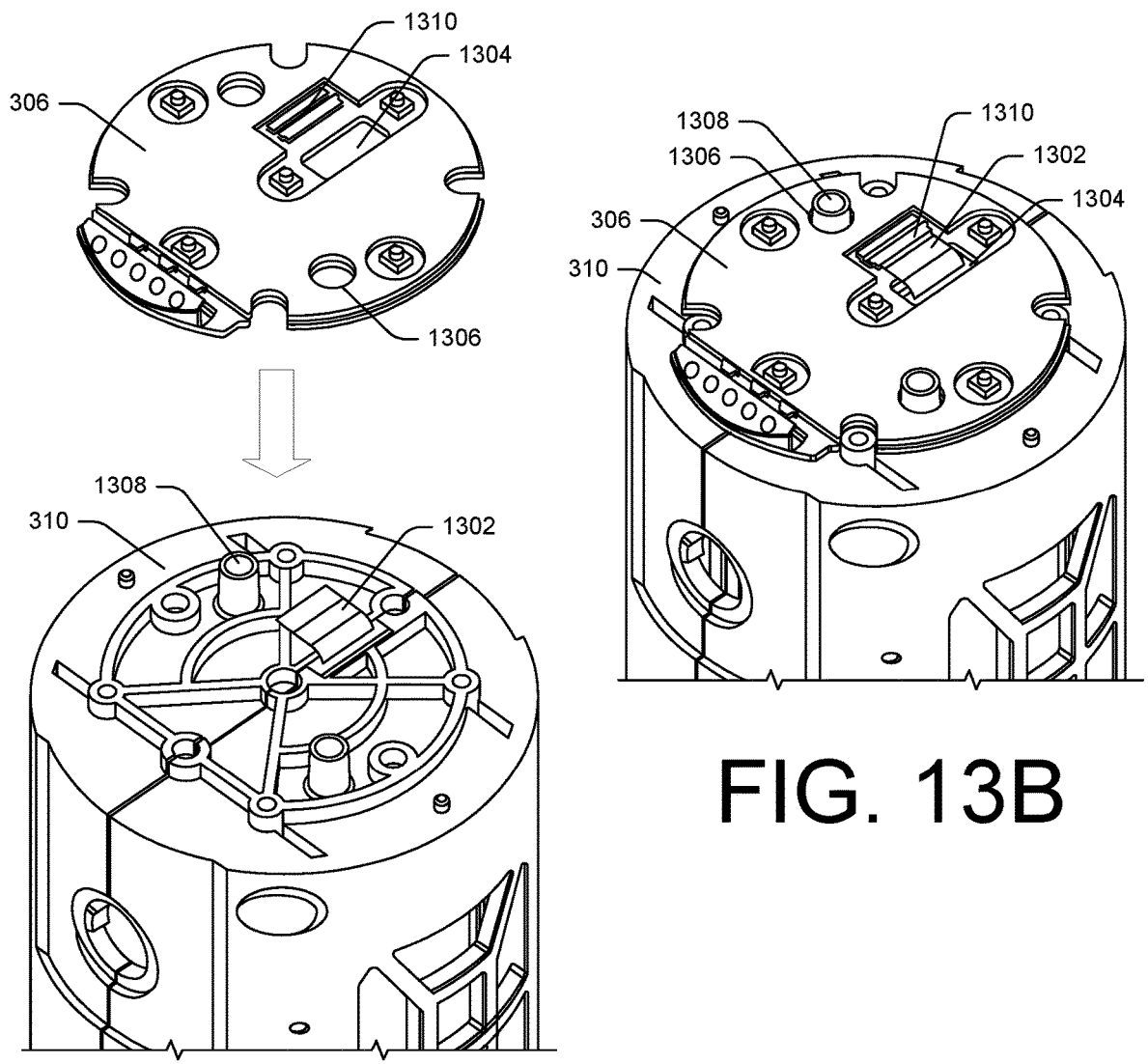
FIG. 13A illustrates a partial exploded view of the example portable audio input/output device of FIG. 1, showing the installation of a printed circuit board navigation component onto an assembly enclosure.
FIG. 13B illustrates a perspective view showing the completed installation of a printed circuit board navigation component onto an assembly enclosure.

FIG. 13A illustrates a partial exploded view of the example portable audio input/output device, showing the installation of a printed circuit board navigation component onto the top of an assembly enclosure.

In some examples, PCB navigation component 306 may be coupled to a top of enclosure assembly 310. In various instances, a cable 1302 may be electronically connected to electrical components interior to enclosure assembly 310. Cable 1302 may then be fed through a hole 1304 in PCB navigation component 306. In various examples, cable 1302 may be any type of communication cable, such as a flex ribbon jumper cable. PCB navigation component 306 may have multiple holes 1306 which align with multiple through-pins 1308 of enclosure assembly 310. In some examples, cable 1302 may be fed through hole 1304 and coupled to connector 1310. Connector 1310 may comprise any type of conductive material and may electrically couple PCB navigation component 306 to electronics stored within enclosure assembly 310 via cable 1302.

While the examples illustrates in FIG. 13A shows cable 1302 coupling to a top surface of PCB navigation component 306, in other examples, cable 1302 may couple a bottom surface of PCB navigation component 306. In some examples, by coupling cable 1302 to the top of PCB navigation component 306, the installation of PCB navigation component 306 to the top of enclosure assembly 310 may be completed with less difficulty than coupling cable 1302 to the bottom of PCB navigation component 306. For example, by attaching cable 1302 to connector 1310 when PCB navigation component 306 is placed on top of enclosure assembly 310, installation may be less difficult than attaching cable 1302 to the bottom of PCB navigation component 306

FIG. 13B illustrates a perspective view showing the completed installation of a printed circuit board navigation component onto an assembly enclosure. In some examples, the multiple holes 1306 of PCB navigation component 306 may be aligned with the multiple through-pins of enclosure assembly 310. Further, cable 1302 may be fed through hole 1304 and be mechanically and/or electrically coupled to connector 1310. In some examples, cable 1302 may communicate inputs received through PCB navigation component 306.

Example Methods

Figure 14:
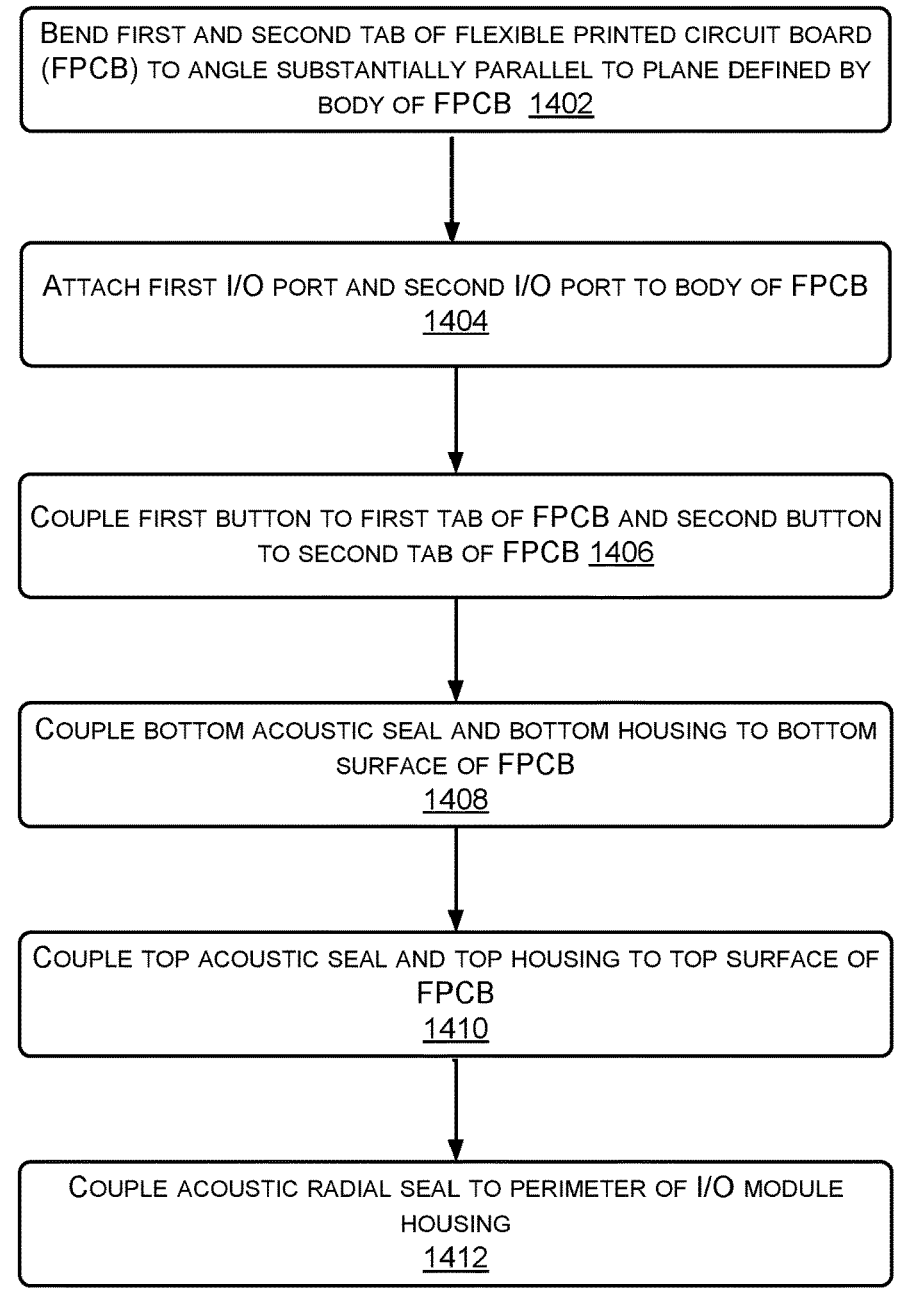
FIG. 14 is a flowchart illustrating an example method of assembling a stand-alone acoustically-sealed I/O interface module.

FIG. 14 is a flowchart illustrating an example method of assembling a stand-alone acoustically-sealed I/O interface module.

At 1402, method 1400 comprises bending a first tab and a second tab of a flexible printed circuit board (PCB) to an angle substantially parallel to a plane defined by a body of the PCB.

At 1404, the method comprises attaching a first I/O port and a second I/O port to the body of the PCB, such that the first I/O port and the second I/O port are oriented in a direction parallel to the plane of the PCB. In some examples, attaching the first I/O port to the body of the PCB comprises coupling the first I/O port directly to a body of the PCB. Attaching the second I/O port to the body of the PCB may comprise coupling a first planar face of a bracket in parallel with the PCB, and coupling a second planar face of the bracket to the second I/O port, the second planar face of the bracket being substantially at right angle relative to the first planar face of the bracket.

At 1406, the method comprises coupling a first button to the first tab of the PCB and coupling a second button to the second tab of the PCB, such that the first button and the second button are actuatable in a direction parallel to the plane defined by the body of the PCB.

At 1408, the method comprises coupling a bottom acoustic seal and a bottom housing to the bottom surface of the PCB such that the bottom acoustic seal is disposed between the bottom housing and the bottom surface of the PCB, the bottom housing having cavities sized to house the first button, second button, first I/O port, and second I/O port. In some examples, coupling the bottom acoustic seal and the bottom housing to the bottom surface of the PCB comprises inserting through-pins of the bottom housing through holes in the bottom acoustic seal and through holes in the body of the PCB.

At 1410, the method comprises coupling a top acoustic seal and a top housing to a top surface of the PCB such that the top acoustic seal is disposed between the top housing and the PCB, the top housing and bottom housing forming an I/O module housing having a perimeter. In some examples, coupling the top acoustic seal and the top housing to the top surface of the PCB comprises inserting the through-pins of the bottom housing through holes in the top acoustic seal and the top housing.

At 1412, the method comprises coupling an acoustic radial seal to a perimeter of the I/O module housing.

Figure 15:
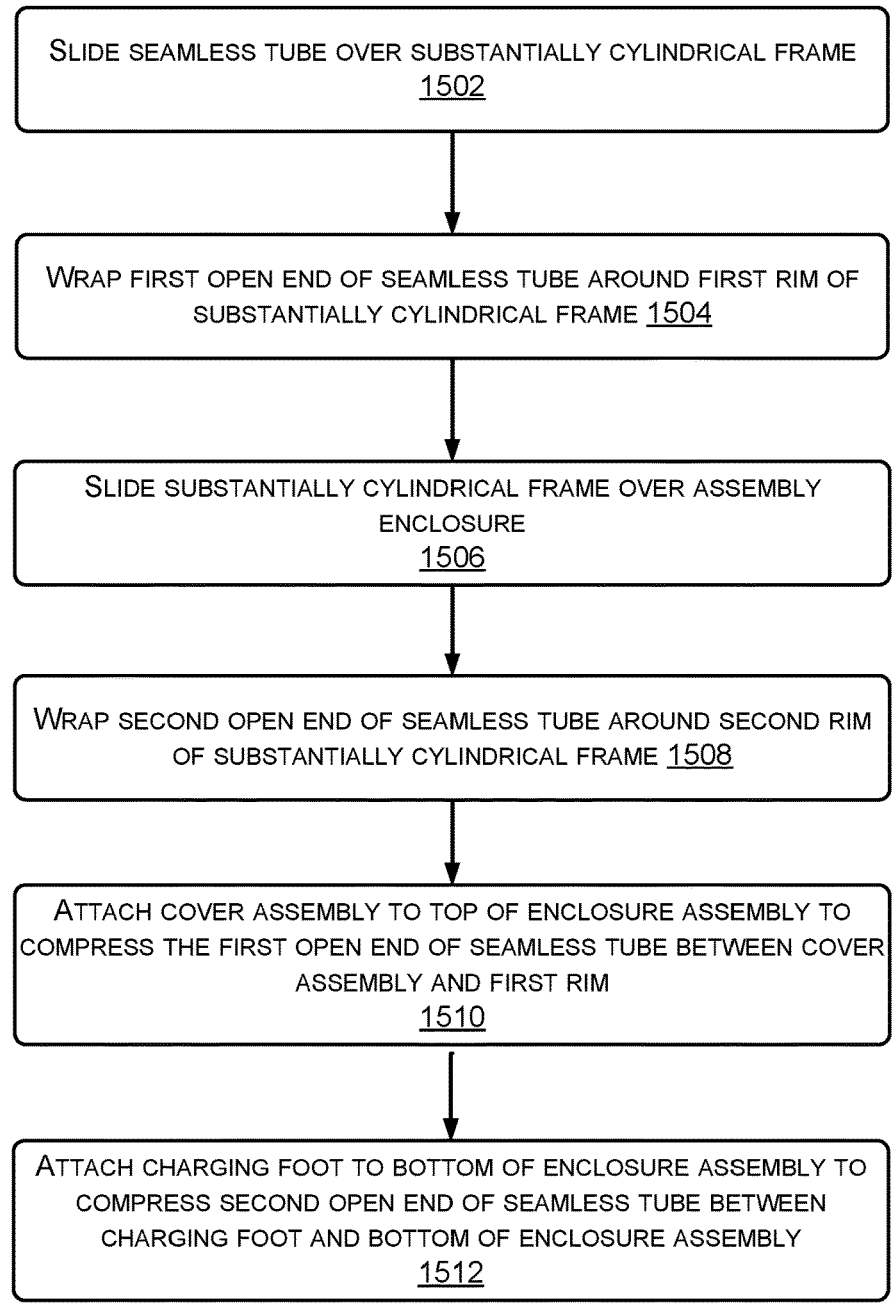
FIG. 15 is a flowchart illustrating an example method of installing a seamless material on the example portable audio/input device of FIG. 1.

FIG. 15 is a flowchart illustrating an example method of installing a seamless material on the example portable audio/input device of FIG. 1.

At 1502, the method 1500 comprises sliding a seamless tube of material over a substantially cylindrical frame. In some examples, the seamless tube of material may extend beyond a first rim of the substantially cylindrical frame and/or a second rim of the substantially cylindrical frame. The seamless tube of material may have a hole in it that, once the seamless tube is over the substantially cylindrical frame, lines up with a hole in the substantially cylindrical frame. The process may wrap a portion of the seamless tube of material into the hole of the substantially cylindrical frame and fix the portion to adhesive disposed on the interior of the substantially cylindrical frame. Further, the process may install a module into the hole of the substantially cylindrical frame and the hole in the seamless tube of material.

At 1504, the method comprises wrapping a first open end of the seamless tube of material around the first rim of the substantially cylindrical frame.

At 1506, the method comprises sliding the substantially cylindrical frame over the assembly disclosure.

At 1508, the method comprises wrapping a second open end of the seamless tube of material around a second rim of the substantially cylindrical frame. The first rim and the second rim may be disposed at opposite ends of the substantially cylindrical frame, such as a bottom and a top end. In various examples, a double sided adhesive may be disposed to the bottom of an assembly disclosure, and at 1406, the second open end of the seamless tube may be pressed against the adhesive and to the bottom of the assembly disclosure.

At 1510, the method comprises attaching the cover assembly to a top of the enclosure assembly to compress the first open end of the seamless tube of material between the cover assembly and the first rim of the substantially cylindrical frame.

At 1512, the method comprises attaching a charging foot to a bottom of the enclosure assembly to compress the second open end of the seamless tube of material between the charging foot and the bottom of the enclosure assembly.

CONCLUSION

While various examples and embodiments are described individually herein, the examples and embodiments may be combined, rearranged and modified to arrive at other variations within the scope of this disclosure.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic device comprising:
a housing having an opening extending therethrough;
a cover coupled to the housing and covering at least a portion of the opening, the cover including a touch input mechanism;
a light source disposed within the housing; and
a light guide disposed above the light source and conveying light from the light source through the cover.

2. The electronic device of claim 1, further comprising a mesh fabric covering at least a portion of an exterior of the housing.

3. The electronic device of claim 1, further comprising a mesh fabric covering at least a portion of an exterior of the housing, the mesh fabric being wrapped over a rim around the opening such that a portion of the mesh fabric is positioned between the rim and the cover.

4. The electronic device of claim 1, further comprising:
a printed circuit board (PCB), disposed below the light guide, and having a top surface facing the light guide, wherein the light source is coupled to the top surface of the PCB.

5. The electronic device of claim 1, further comprising:
a microphone disposed within the housing; and
a speaker disposed within the housing.

6. The electronic device of claim 1, wherein the opening is a first opening, further comprising:
a mesh fabric covering at least a portion of an exterior of the housing;
a bottom cover coupled to the housing and covering a second opening in the housing,
wherein the mesh fabric is wrapped over a rim around the second opening such that a portion of the mesh fabric is positioned between the rim and the bottom cover.

7. The electronic device of claim 1, further comprising:
a printed circuit board (PCB) having a top surface facing the light guide and a bottom surface, wherein the light source is coupled to the top surface; and
a speaker coupled to the bottom surface.

8. An electronic device comprising:
a housing having an opening extending therethrough;
a cover coupled to the housing and covering at least a portion of the opening, the cover including a touch input mechanism;
a light source disposed within the housing;
a light guide disposed above the light source and conveying light from the light source through the cover; and
a mesh fabric covering at least a portion of an exterior of the housing, the mesh fabric being wrapped over a rim around the opening such that a portion of the mesh fabric is positioned between the rim and the cover.

9. The electronic device of claim 8, further comprising:
a printed circuit board (PCB), disposed below the light guide, and having a top surface facing the light guide, wherein the light source is coupled to the top surface of the PCB.

10. The electronic device of claim 8, further comprising:
a microphone disposed within the housing; and
a speaker disposed within the housing.

11. The electronic device of claim 8, wherein the opening is a first opening, and the rim is a first rim, further comprising:
a bottom cover coupled to the housing and covering a second opening in the housing,
wherein the mesh fabric is wrapped over a second rim around the second opening such that a portion of the mesh fabric is positioned between the second rim and the bottom cover.

12. The electronic device of claim 8, further comprising:
a printed circuit board (PCB) having a top surface facing the cover and a bottom surface, wherein the light source is coupled to the top surface; and
a speaker coupled to the bottom surface.

13. An audio input/output device comprising:
a housing having an opening extending therethrough;

a cover coupled to the housing and covering at least a portion of the opening, the cover including a touch input mechanism;

a light source disposed within the housing; and a light guide disposed above the light source and conveying light from the light source through the cover.

14. The audio input/output device of claim 13, further comprising a mesh fabric covering at least a portion of an exterior of the housing.

15. The audio input/output device of claim 13, further comprising a mesh fabric covering at least a portion of an exterior of the housing, the mesh fabric being wrapped over a rim around the opening such that a portion of the mesh fabric is positioned between the rim and the cover.

16. The audio input/output device of claim 13, further comprising:

a printed circuit board (PCB), disposed below the light guide, and having a top surface facing the light guide, wherein the light source is coupled to the top surface of the PCB.

17. The audio input/output device of claim 13, further comprising:

a microphone disposed within the housing; and a speaker disposed within the housing.

18. The audio input/output device of claim 13, wherein the opening is a first opening, further comprising:

a mesh fabric covering at least a portion of an exterior of the housing;

a bottom cover coupled to the housing and covering a second opening in the housing, wherein the mesh fabric is wrapped over a rim around the second opening such that a portion of the mesh fabric is positioned between the rim and the bottom cover.

19. The audio input/output device of claim 13, further comprising:

a printed circuit board (PCB) having a top surface facing the light guide and a bottom surface, wherein the light source is coupled to the top surface; and a speaker coupled to the bottom surface.

* * * * *